United States Patent
Tokuhisa

(10) Patent No.: US 9,882,340 B2
(45) Date of Patent: Jan. 30, 2018

(54) LASER DEVICE, AND EXPOSURE DEVICE AND INSPECTION DEVICE PROVIDED WITH THE LASER DEVICE

(71) Applicant: NIKON CORPORATION, Tokyo (JP)

(72) Inventor: Akira Tokuhisa, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/137,630

(22) Filed: Apr. 25, 2016

(65) Prior Publication Data

US 2016/0240993 A1 Aug. 18, 2016

Related U.S. Application Data

(63) Continuation of application No. PCT/JP2014/078218, filed on Oct. 23, 2014.

(30) Foreign Application Priority Data

Oct. 25, 2013 (JP) ................. 2013-222263

(51) Int. Cl.
*H01S 3/067* (2006.01)
*G03F 7/20* (2006.01)
(Continued)

(52) U.S. Cl.
CPC ...... *H01S 3/06754* (2013.01); *G03F 7/70025* (2013.01); *H01S 3/1003* (2013.01);
(Continued)

(58) Field of Classification Search
None
See application file for complete search history.

(56) References Cited

U.S. PATENT DOCUMENTS

| 5,534,970 A | 7/1996 | Nakashima et al. |
| 6,118,564 A | 9/2000 | Ooi et al. |
| (Continued) |

FOREIGN PATENT DOCUMENTS

| JP | H07-142354 A | 6/1995 |
| JP | H10-178418 A | 6/1998 |
| (Continued) |

OTHER PUBLICATIONS

Jan. 27, 2015 Search Report issued in International Patent Application No. PCT/JP2014/078218.
(Continued)

*Primary Examiner* — Steven H Whitesell Gordon
(74) *Attorney, Agent, or Firm* — Oliff PLC

(57) ABSTRACT

A laser device includes: a laser light source which generates a laser light in a pulse waveform of preset predetermined frequency; intensity modulator which is driven with a transmittance waveform wherein transmittance changes at either the predetermined frequency or an integer-multiple frequency thereof and which extracts and outputs the laser light which is outputted from the laser light source; control unit which controls an operation of the intensity modulator; an amplifier which amplifies the laser light which is outputted from the intensity modulator; and a wavelength conversion optical element which converts a wavelength of the laser light which is amplified by the amplifier, wherein the control unit changes relative timing of the transmittance waveform with respect to the pulse waveform, thereby changing the pulse waveform of the laser light which is emitted from the intensity modulator, to output a pulse light of predetermined waveform from the wavelength conversion optical element.

19 Claims, 15 Drawing Sheets

(51) Int. Cl.
  *H01S 3/10* (2006.01)
  *H01S 3/23* (2006.01)
  *H01S 3/16* (2006.01)
  *H01S 3/00* (2006.01)

(52) U.S. Cl.
  CPC ........ *H01S 3/10015* (2013.01); *H01S 3/2391* (2013.01); *H01S 3/0085* (2013.01); *H01S 3/0092* (2013.01); *H01S 3/1618* (2013.01)

(56) References Cited

U.S. PATENT DOCUMENTS

| | | | |
|---|---|---|---|
| 6,901,090 B1 | 5/2005 | Ohtsuki | |
| 2008/0030847 A1 | 2/2008 | Murison et al. | |
| 2009/0073407 A1* | 3/2009 | Okita | G02B 26/125 355/53 |
| 2011/0019705 A1 | 1/2011 | Adams et al. | |
| 2011/0211184 A1* | 9/2011 | Tokuhisa | G02F 1/353 355/67 |
| 2014/0049811 A1 | 2/2014 | Noh et al. | |
| 2014/0177033 A1 | 6/2014 | Noh et al. | |
| 2016/0111849 A1 | 4/2016 | Shin | |

FOREIGN PATENT DOCUMENTS

| | | |
|---|---|---|
| JP | 2001-085771 A | 3/2001 |
| JP | 2004-086193 A | 3/2004 |
| JP | 2010-003771 A | 1/2010 |
| JP | 4517271 B2 | 8/2010 |
| JP | 2012-054500 A | 3/2012 |
| KR | 101304424 B1 | 9/2013 |
| WO | 01/20398 A1 | 3/2001 |
| WO | 2012/148062 A1 | 11/2012 |

OTHER PUBLICATIONS

Apr. 26, 2017 Extended Search Report issued in European Patent Application No. 14855645.9.
Oct. 31, 2017 Office Action issued in Japanese Patent Application No. 2015-543905.
Sep. 30, 2017 Office Action issued in Taiwanese Patent Application No. 103136738.

* cited by examiner

US 9,882,340 B2

LASER DEVICE, AND EXPOSURE DEVICE AND INSPECTION DEVICE PROVIDED WITH THE LASER DEVICE

This application is a continuation of International Application No. PCT/JP2014/078218 filed on Oct. 23, 2014.

INCORPORATION BY REFERENCE

The disclosure of the following priority application and the International Application are herein incorporated by reference:
Japanese Patent Application No. 2013-222263 filed on Oct. 25, 2013); and
International Application No. PCT/JP2014/078218 filed on Oct. 23, 2014.

BACKGROUND

1. Technical Field

The present invention relates to a laser device comprising a laser light source that generate a laser light in a pulse waveform, an intensity modulator which extracts and emits the laser light which is outputted from the laser light source, an amplifier which amplifies the laser light which is emitted from the intensity modulator, and a wavelength conversion optical element which converts the wavelength of the laser light which is amplified by the amplifier. The present invention also relates to a system, such as an exposure device or an inspection device, provided with such a laser device.

2. Description of Related Art

The laser device as mentioned above is used, for instance, as a light source for laser systems such as a microscope, a shape measurement device, an exposure device, and an inspection device. The output wavelength of the laser device is set according to the usage and function of a system in which the laser device is installed. For instance, a laser device which outputs a pulse light having a wavelength of 193 nm, a laser device which outputs a pulse light having a wavelength of 355 nm, etc. are known. The wavelength of a laser light generated from the laser light source, the number of rows and the number of stages of the amplifier, the types and combinations of wavelength conversion optical elements provided in the wavelength conversion unit are set according to the usage and function of the laser system (see Japanese Laid-Open Patent Publication No. 2004-86193).

An example of such a laser device as mentioned above is known, which includes, as means for turning on/off the light (ultraviolet light) which is outputted from the laser device, a construction which changes the pulse waveform of the laser light which enters an amplifier based on high and low efficiencies of wavelength conversion in the wavelength conversion optical element. For instance as shown in FIG. 13, if it is desired to turn on the output light, a first laser light in a pulse waveform having a relatively short pulse duration and a high peak power (hereafter, referred to as "first pulse light") Ls1 is outputted from a laser light source 910 at a predetermined period, whereas if it is desired to turn off the ultraviolet light, a second laser light in a pulse waveform having a relatively long pulse duration and a relatively low peak power (hereafter, referred to as "second pulse light") Ls2 is outputted from the laser light source 910 at the same period as above.

The first pulse light Ls1 and the second pulse light Ls2 have different pulse durations and different peak powers from each other. However, they have substantially the same energy of light pulse energy (average power per unit time). The second pulse light Ls2 is output at the predetermined frequency also in case it is desired to turn off the output light to keep constant an inverted distribution state of the amplifier. In addition to the above-mentioned construction, in which the state of light emission of the laser light source 910 is directly modulated, a technology has been proposed, in which an intensity modulator is provided between the laser light source and the amplifier to enable a portion of the laser light which is outputted from the laser light source to be extracted by the intensity modulator so that a first pulse light Ls1 and a second pulse light Ls2 are outputted (see refer Japanese Patent No. 4517271).

SUMMARY

A first technology as shown in FIG. 14 is conceived as another means for outputting a laser light that a first pulse light Ls1 and a second pulse light Ls2 are combined. This laser light source 920 includes a first laser light source 921 for generating the first pulse light and a second laser light source 922 for generating the second pulse light. The lights from these light sources are multiplexed together by a coupler or the like and outputted to the amplifier. Then, the first pulse light Ls1 and the second pulse light Ls2 are outputted from the first laser light source 921 and the second laser light source 922 respectively according to the on/off pattern of the output light. That is, in a time domain in which the output light is on, the first pulse light Ls1 is caused to be outputted from the first laser light source 921 at a predetermined period and in a time domain in which the output light is off, the second pulse light Ls2 is caused to be outputted from the second laser light source 922 at the same period as above. As a result, the laser light which is outputted from the laser light source to the amplifier is a laser light that the first pulse light Ls1 and the second pulse light Ls2 are combined, in the same manner as that in the case shown in FIG. 13.

A second technology as shown in FIG. 15 is conceived as a still another means for outputting a combined laser light that a first pulse light Ls1 and a second pulse light Ls2 are combined. The laser light source 930 includes a first laser light source 931 for generating a first pulse light, a second laser light source 932 for generating a second pulse light, and an EO optical switch 935 which has two input ports and outputs either one of the first pulse light Ls1 which is outputted from the first laser light source 931 or the second pulse light Ls2 which is outputted from the second laser light source 932 to the amplifier. The first laser light source 931 and the second laser light source 932 are synchronously controlled and constantly driven to oscillate. The first pulse light Ls1 and the second pulse light Ls2 enter the EO optical switch 935. The EO optical switch is operated according to the on/off pattern of the output light to allow either the first pulse light Ls1 or the second pulse light Ls2 to be outputted to the amplifier. That is, in a time domain in which the output light is on, the first pulse light Ls1, which has been inputted from the first laser light source 931 into the EO optical switch 935, is outputted, while in a time domain in which the output light is off, the second pulse light Ls2, which has been inputted from the second laser light source 932 into the EO optical switch 935, is outputted. As a result, the laser light outputted from the laser light source to the amplifier is a laser light that the first pulse light Ls1 and the second pulse light Ls2 are combined, in the same manner as that in the case shown in FIG. 13.

The first technology shown in FIG. 14 enables drive control of the laser light source to be achieved in a more simplified manner than is achieved by the conventional technology shown in FIG. 13. According to the second technology as shown in FIG. 15, it is possible to achieve the drive control of the laser light source in a more simplified manner and in addition, it is possible to cause the first laser light source 931 and the second laser light source 932 to operate stably.

To control the output light which is outputted from the laser device in any on/off pattern in units of 1 pulse, high speed and high precision switching between a state in which the first pulse light Ls1 is outputted and a state in which the second pulse light Ls2 is outputted to and fro is necessary. However, to achieve this, the conventional technology and the first technology and the second technology mentioned above have the following difficulty.

Drive circuit for a semiconductor laser used as a laser light source and a drive circuit for an EOM (Electro Optic Modulator), such as an EO intensity modulator or an EO optical switch, include high-frequency circuits. Commonly, high-frequency circuits use many AC connections. In the circuit construction including AC connections, a time constant Tc corresponding to a cutoff frequency emerges in an output from the circuit. For instance, in a construction in which a laser light source is directly turned on/off to output either the first pulse light Ls1 or the second pulse light Ls2, turning on/off the laser light source on a time scale longer than the time constant Tc which corresponds to the cutoff frequency of the laser light source results in a failure in stably outputting the first pulse light Ls1 or the second pulse light Ls2, due to a considerable difference in condition of the high-frequency circuit, at immediately after the switching, from the stationary condition. The same is true for the operation of EOMs such as an EO intensity modulator and an EO optical switch.

For instance, to output a pulse light having a relatively short pulse duration (~100 ps) by gain switching operation of a semiconductor laser, the peak intensity and time duration of the pulse light depend each greatly on the bias level applied to the semiconductor laser. Random switching on/off of the semiconductor laser results in an unstable bias level and unstable emission of a short pulse light by gain switching.

The first aspect exemplifying the present invention is a laser device. This laser device comprises: a laser light source which generates a laser light in a pulse waveform of a preset predetermined frequency f; an intensity modulator which is driven with a transmittance waveform wherein transmittance changes at either the predetermined frequency for an integer-multiple frequency thereof and which extracts and outputs the laser light which is outputted from the laser light source; a control unit which controls an operation of the intensity modulator; an amplifier which amplifies the laser light which is outputted from the intensity modulator; and a wavelength conversion optical element which converts a wavelength of the laser light which is amplified by the amplifier, The control unit changes relative timing of the transmittance waveform with respect to the pulse waveform, thereby changing the pulse waveform of the laser light which is emitted from the intensity modulator, to output a pulse light of a predetermined waveform from the wavelength conversion optical element.

It can be constituted so that the laser light which is outputted from the intensity modulator includes either a laser light in a first pulse waveform of the predetermined frequency f or a laser light in a second pulse waveform of the predetermined frequency f which has different timing with respect to that of the laser light in the first pulse waveform, the laser light in the first pulse waveform is a light which is set so that an efficiency of wavelength conversion at the wavelength conversion optical element is relatively high so as to generate the pulse light, the laser light in the second pulse waveform is a light which is set to have energy substantially the same as that of the laser light in the first pulse waveform and a relatively low efficiency of wavelength conversion at the wavelength conversion optical element so as not to generate. Here, the state of "not to generate the pulse light" means that the pulse light of effective output level is not generated, for instance, the state in which an extinction ratio with respect to the pulse light as an output light is equal to 1:100 or more.

In the laser device of the first form (for instance, the laser device of the first to the third construction form of an embodiment) included in the present aspect, following constitution is exemplified. That is, the laser light source includes a first laser light source that generates a laser light in the first pulse waveform of the predetermined frequency f and a second laser light source which generates a laser light in a second pulse waveform of the predetermined frequency fat timing different from timing at which the first laser light in a pulse waveform is generated. The laser light in the first pulse waveform which is outputted from the first laser light source and the laser light in the second pulse waveform which is outputted from the second laser light source are multiplexed and inputted into the intensity modulator. The transmittance waveform is an on/off gate-like waveform which is switched between a transmission state in which the laser light is transmitted at the predetermined frequency f and a shutoff state in which the laser light is shutoff. And the control unit changes relative timing of the transmittance waveform with respect to the first pulse waveform and the second pulse waveform, thereby changing the pulse waveform of the laser light which transmitted through the intensity modulator.

In this case, the laser light in the first pulse waveform and the laser light in the second pulse waveform can be set so as to differ in peak intensity thereof from each other, thereby enabling each of efficiencies at the wavelength conversion optical element are relatively different from each other. Also, the laser light in the first pulse waveform and the laser light in the second pulse waveform can be set so as to differ in wavelength thereof from each other; thereby enabling each of efficiencies at the wavelength conversion optical element are relatively different from each other. Further, the laser light in the first pulse waveform and the laser light in the second pulse waveform can be set so as to differ in a state of polarization upon entering the wavelength conversion optical element from each other, thereby enabling each of efficiencies at the wavelength conversion optical element are relatively different from each other.

The first laser light source and the second laser light source can be each a semiconductor laser. Alternatively, the laser device can be constituted that the first laser light source is a mode-locked laser which generates the laser light in the first pulse waveform at the predetermined frequency f and the second laser light source is a semiconductor laser, a photodetector which detects the laser light in the first pulse waveform which is outputted from the mode-locked laser; and a synchronization circuit (for instance, the pulse synchronization control circuit 85 of the embodiment) which, based on the first pulse waveform which is detected by the photodetector, outputs a synchronization signal to a drive power source of the second laser light source and to the control unit.

In the laser device, it can be constituted that the laser light in the first pulse waveform which is outputted from the first laser light source and the laser light in the second pulse waveform which is outputted from the second laser light source are once multiplexed and then divided into a plurality of branch optical paths, each of the intensity modulator, the wavelength conversion optical element, and the amplifier is provided at each of the plurality of branch optical paths, the control unit changes the relative timing of the transmittance waveform with respect to the first pulse waveform and the second pulse waveform for each branch optical path, thereby enabling each of the waveform conversion optical elements to output a plurality of pulse lights of different pulse waveforms.

In the laser device of the second form (for instance, the laser device of the fourth construction form of the embodiment) included in the present aspect, following construction is exemplified. That is, the laser light source that generates a laser light of a base waveform at the predetermined frequency f, the transmittance waveform is a high and low gate-like waveform in which a first transmittance waveform which has a relatively high transmittance and with which the laser light in the first pulse waveform is extracted from the laser light of the base waveform and a second transmittance waveform which has a relatively low transmittance and with which the laser light in the second pulse waveform is extracted from the laser light of the base waveform are alternately repeated each at the predetermined frequency f, and the control unit changes relative timing of the transmittance waveform with respect to the base waveform, thereby changing the pulse waveform of the laser light that transmitted through the intensity modulator.

In the laser device of the third form (for instance, the laser device of the fifth construction form of the embodiment) included in the present aspect, following constitution is exemplified. That is, the laser light source includes a first laser light source that generates a laser light of a first base waveform at the predetermined frequency f and a second laser light source that generates a laser light of a second base waveform at the predetermined frequency f and at different timing from that at which the laser light of the first base waveform is generated, the laser light of the first base waveform which is outputted from the first laser light source and the laser light of the second base waveform which is outputted from the second laser light source are multiplexed and inputted into the intensity modulator, the transmittance waveform is a gate-like waveform in which a first transmittance waveform with which the laser light in the first pulse waveform is extracted from the laser light of the first base waveform and a second transmittance waveform with which the laser light in the second pulse waveform is extracted from the laser light of the second base waveform are alternately repeated each at the predetermined frequency f, the control unit changes relative timing of the transmittance waveform with respect to the first base waveform and the second base waveform, thereby changing the pulse waveform of the laser light that transmitted through the intensity modulator.

In this laser device, each waveform can be set as follows. The laser light in the first pulse waveform and the laser light in the second pulse waveform may be set so as to differ in peak intensity thereof from each other, thereby enabling each of efficiencies at the wavelength conversion optical element are relatively different from each other. Also, the laser light in the first base waveform and the laser light in the second base waveform may be set so as to differ in wavelength thereof from each other, thereby enabling each of efficiencies at the wavelength conversion optical element are relatively different from each other. Further, the laser light in the first base waveform and the laser light in the second base waveform may be set so as to differ in a state of polarization upon entering the wavelength conversion optical element from each other, thereby enabling each of efficiencies at the wavelength conversion optical element are relatively different from each other.

The laser device of the third form can be constituted as follows. That is, the laser light in the first base waveform which is outputted from the first laser light source and the laser light in the second base waveform which is outputted from the second laser light source are once multiplexed and then divided into a plurality of branch optical paths, each of the intensity modulator, the wavelength conversion optical element, and the amplifier is provided at each of the plurality of branch optical paths, the control unit changes the relative timing of the transmittance waveform with respect to the first pulse waveform and the second pulse waveform for each branch optical path, thereby enabling each of the waveform conversion optical elements to output a plurality of pulse lights of different pulse waveforms.

The second aspect of the present invention is an exposure device. The exposure device of the first construction form of the present aspect comprises: the laser device according to any one of which described above; a mask support unit that holds a photomask on which a predetermined exposure pattern is formed; an exposure target support unit that holds an exposure target; an illumination optical system that illuminates the photomask held by the mask support unit with the laser light outputted from the laser device; and a projection optical system that projects the light which has transmitted the photomask onto the exposure target which is held by the exposure target support unit.

The exposure device of the second construction form of the second aspect comprises: the laser device according to any one of which described above; a variable forming mask which has a plurality of movable mirrors and generates a light of any desired pattern; an exposure target support unit which holds an exposure target; an illumination optical system which illuminates the variable forming mask with the laser light outputted from the laser device; and a projection optical system that projects the light of any desired pattern generated via the variable forming mask onto the exposure target which is held by the exposure target support unit.

The exposure device of the third construction form of the second aspect comprises: the laser device according to any one of which described above; an exposure target support unit which holds an exposure target; a deflection unit which deflects the laser light which is outputted from the laser device to scan the exposure target which is held on the exposure target support unit; and an objective optical system which forms an image of the light deflected by the deflection unit on the exposure target.

The third aspect of the present invention is an inspection device. This inspection device comprises: the laser device according to any one of which described above; an inspection target support unit which holds an inspection target; an illumination optical system which illuminates the inspection target which is held by the inspection target support unit with the laser light which is outputted from the laser device; and a projection optical system that projects the light from the inspection target onto a detector.

The laser device according to the first aspect of the present invention includes a laser light source which generates a laser light in a pulse waveform of a preset predetermined frequency f and an intensity modulator which is driven with a transmittance waveform wherein transmittance changes at either the predetermined frequency for an frequency that is an integer-multiple thereof, and wherein a control unit changes relative timing of the transmittance waveform with respect to the pulse waveform, thereby changing the pulse waveform of the laser light which is emitted from the intensity modulator, to output a pulse light of a predetermined waveform from the wavelength conversion optical element. That is, both the laser light source and the intensity modulator are each stably driven at the predetermined frequency f. The control unit changes relative timing of the transmittance waveform with respect to the pulse waveform to cause the wavelength conversion optical element to output a pulse light of the predetermined waveform. This enables to provide a laser device which can perform switching of output light at high speed and stably in arbitrary time axis regardless of the cutoff frequency of the laser light source or of the EOM.

The laser light which is emitted from the intensity modulator includes either one of a laser light in a first pulse waveform of a predetermined frequency f and a laser light in a second pulse waveform of the same predetermined frequency f and different timing from that of the laser light in the first pulse waveform. Of these, the laser light in the first pulse waveform is a light which is set to have a relatively high efficiency of wavelength conversion at the wavelength conversion optical element so as to generate a pulse light. The laser light in the second pulse waveform is a light which is set to have energy substantially the same as that of the laser light in the first pulse waveform and a relatively low efficiency of wavelength conversion at the wavelength conversion optical element so as not to generate a pulse light. Such construction enables to provide a laser device which can perform high speed and stable on/off operation of output light in arbitrary time axis.

An exposure device according to a second aspect includes the laser device according to the first aspect. This enables to provide an exposure device having an improved accuracy of exposure with high speed and stable output light.

An inspection device according to a third aspect includes the laser device according to the first aspect. This enables to provide an inspection device having an improved accuracy of inspection with high speed and stable output light.

BRIEF DESCRIPTION OF DRAWINGS

FIG. 11 is a schematic construction diagram showing an exposure device according to a third construction form of the present invention presented as a third application example of a system provided with a laser device;

FIG. 13 is a diagram illustrating schematic construction and operation of a laser light generation unit in a conventional laser device;

DESCRIPTION OF EMBODIMENTS

Figure 1:
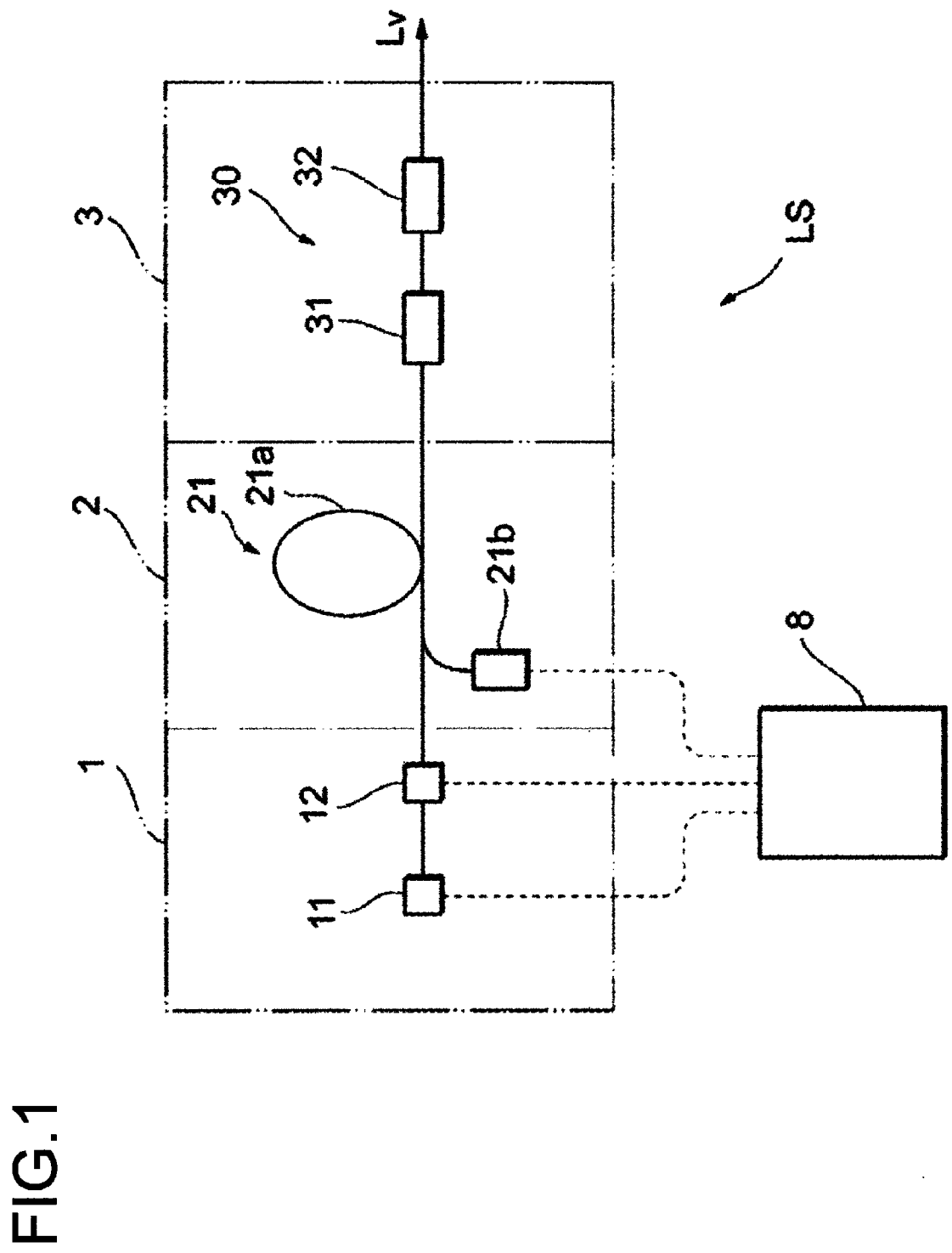
FIG. 1 is a schematic construction diagram showing an example of a laser device in which the present invention is adopted.

Hereafter, embodiments of the present invention are explained with reference to the drawings. A schematic construction diagram showing an example of a laser device LS according to an aspect of the present invention is presented in FIG. 1. The laser device LS includes a laser light generation unit 1 which outputs a laser light in a pulse waveform (seed light), an amplification unit 2 which amplifies the seed light which is outputted from the laser light generation unit 1, a wavelength conversion unit 3 which converts the wavelength of the amplified light which is outputted from the amplification unit 2, and a control unit 8 which controls the operation of each of the units.

Specific constructions of the laser light generation unit 1, the amplification unit 2, and the wavelength conversion unit 3 may include many construction forms as shown in, for instance, the above-mentioned patent literatures. In the present embodiment, explanation is made on an example in which the seed light which is outputted from the laser light generation unit 1 is infrared light in a wavelength band of 1.06 μm and the output light which is outputted from the wavelength conversion unit 3 is ultraviolet light in a wavelength band of 355 nm. In the present embodiment, explanation is made mainly on a construction that enables turning on/off of ultraviolet light at high speed and with a stable output level.

The laser light generation unit 1 includes a laser light source 11 and an intensity modulator 12. The laser light source 11 generates a laser light in a pulse waveform having an oscillation wavelength in a 1.06 μm band and a preset predetermined frequency f. Examples of the laser light source 11 include a semiconductor laser, a fiber laser, and a mode-locked laser. The intensity modulator 12 is driven so as to present a transmittance waveform in which transmittance varies in the above-mentioned predetermined frequency for in an frequency of (n>2) that is an integer-multiple thereof and extracts and emits the laser light which is outputted from the laser light source 11. An example of the intensity modulator 12 is an EO (Electro Optic effect) intensity modulator.

The control unit 8 changes relative timing of the pulse waveform in which the laser light source 11 is driven and the transmittance waveform in which the intensity modulator 12 is driven to thereby switch the pulse waveform of the seed light which is emitted from the intensity modulator 12 between the first pulse waveform and the second pulse waveform one from another.

The laser light in the first pulse waveform (hereafter, referred to as "first seed light") is a light which is set so that an efficiency of wavelength conversion at the wavelength conversion unit 3 is relatively high to cause ultraviolet light to be generated. The laser light in the second pulse waveform (hereafter, referred to as "second seed light") is a light which is set to have a pulse energy substantially the same as that of the first seed light, and that the efficiency of wavelength conversion at the wavelength conversion unit 3 is relatively low so as not to cause ultraviolet light to be generated (to cause extinction ratio to become higher). The first seed light and the second seed light both have the predetermined frequency f but they are emitted from the intensity modulator 12 at different timing. That is, in one time domain, the first seed light is emitted from the intensity modulator 12 at a frequency f and in another time domain, the second seed light is emitted from the intensity modulator 12 at a frequency f. As a result, the seed light which is emitted from the intensity modulator 12 includes either one of the first seed light or the second seed light at arbitrary time (detailed explanation of this will be made later). The seed light which is emitted from the intensity modulator 12 is outputted from the laser light generation unit 1 and enters the amplification unit 2.

The amplification unit 2 includes a fiber amplifier 21 which amplifies the seed light (the first seed light, the second seed light) which is outputted from the laser light generation unit 1. As the fiber amplifier 21 which amplifies the seed light having a wavelength in a 1.06 μm band may be advantageously used a ytterbium-doped fiber amplifier (YDFA). The fiber amplifier (YDFA) 21 includes as main components an amplifying fiber 21a in which ytterbium (Yb) is doped in a core and an excitation light source 21b which supplies excitation light to the amplifying fiber. The operation of the fiber amplifier 21 is controlled by the control unit 8. This control is achieved by setting adjusted drive power for driving the excitation light source 21b which supplies excitation light to the amplifying fiber 21a.

The seed light which is emitted from the intensity modulator 12 and enters the fiber amplifier 21 is either one of the first seed light or the second seed light at arbitrary time, with the first seed light and the second seed light having the same frequency f and the same energy. For instance, as mentioned above, the first seed light is emitted from the intensity modulator 12 at a frequency fin one time domain and the second seed light is emitted from the intensity modulator 12 at a frequency fin another time domain. As a result, the inverted distribution state of ytterbium (Yb) atom at the fiber amplifier 21 is always maintained in a constant state. The first seed light and the second seed light which enter the amplification unit 2 are amplified by the fiber amplifier 21 and outputted from the amplification unit 2 as a first amplified light and a second amplified light, respectively.

FIG. 1 shows a construction in which the amplification unit 2 includes a single stage fiber amplifier 21. The amplification unit 2 may be constituted by a plurality of fiber amplifiers connected to each other in series, for instance, by connecting a plurality of single clad fiber amplifiers to each other in series or by connecting a single clad fiber amplifier and a double clad fiber amplifier to each other. The first amplified light and the second amplified light each having a wavelength in a 1.06 μm band which are outputted from the amplification unit 2 enter the wavelength conversion unit 3.

The wavelength conversion unit 3 is provided with a wave length conversion optical system 30 through which the amplified light (first amplified light, second amplified light) which is outputted from the amplification unit 2 propagate. The exemplified wave length conversion optical system 30 includes as main components a wavelength conversion optical element 31 and a wavelength conversion optical element 32 and also includes a lens and a wavelength plate and so on, which are not shown in the figure. The amplified light, which enters the wavelength conversion unit 3, enters the wavelength conversion optical element 31 through lens.

The wavelength conversion optical element 31 is a non-linear optical crystal for generating a second harmonic of the amplified light by second harmonic generation (SHG). The wavelength conversion optical element 32 is a non-linear optical crystal for generating a third harmonic of the amplified light from the second harmonic of the amplified light which is generated at the wavelength conversion optical element 31 and fundamental wave of the amplified light which transmitted through the wavelength conversion optical element by sum frequency generation (SFG). The outputting stage of the wavelength conversion unit 3 is provided with a separation element (not shown). The separation unit allows ultraviolet light having a wavelength of 355 nm, which is a third harmonic of the amplified light, to be outputted from the wavelength conversion unit. It disallows light having a wavelength longer than this to be outputted from the wavelength conversion unit, i.e., it eliminates such longer wavelength light.

Examples of the wavelength conversion optical element 31 which can be used include bulk crystals such as an LBO ($LiB_3O_5$) crystal and a BBO ($\beta$-$BaB_2O_4$) crystal, or quasi phase matching (QPM) crystals such as a PPLN (Periodically Poled $LiNbO_3$) crystal and a PPLT (Periodically Poled $LiTaO_3$) crystal. Examples of the wavelength conversion optical element 32 include a LBO crystal, a BBO crystal, and a CLBO ($CsLiB_6O_{10}$) crystal.

The first seed light, from which the first amplified light is generated, is light which is set to have a relatively high efficiency of wavelength conversion at the wavelength conversion unit 3, so that ultraviolet light is generated. The second seed light, from which the second amplified light is generated, is light which is set to have energy which is substantially the same as the energy of the first seed light and have a relatively low efficiency of wavelength conversion at the wavelength conversion unit 3 so as not to generate ultraviolet light. As a result, if the amplified light which enters the wavelength conversion unit 3 is the first amplified light, the wavelength of the amplified light is converted by the wavelength conversion optical elements 31, 32 at a high efficiency and ultraviolet light Lv having a wavelength of 355 mm, which is a third harmonic of the first amplified light, is outputted. On the other hand, if the amplified light which enters the wavelength conversion unit 3 is the second amplified light, the wavelength of the amplified light is not converted by the wavelength conversion optical elements 31, 32 at high efficiencies so that no ultraviolet light having a wavelength of 355 mm is outputted.

In the laser device LS having such a construction as described above, both the laser light source 11 and the intensity modulator 12 are constantly driven at the predetermined frequency f. Then, the control unit 8 controls on/off of the ultraviolet light (output light) Lv having a wavelength of 355 nm by changing the relative timing of the pulse waveform with which the laser light source 11 is driven with respect to the transmittance waveform with which the intensity modulator 12 is driven, and thus switching the pulse waveform of the seed light which is emitted from the intensity modulator 12 to either one of the first seed light and the second seed light. The first amplified light and the second amplified light have different efficiencies of wavelength conversion at the light wavelength conversion unit 3 but both the pulse lights have the same frequency and energy. As a result, high speed and stable on/off operation of the output light at arbitrary time axis can be achieved regardless of the cutoff frequency of the laser light source 11 or the intensity modulator 12.

As stated above, a basic construction of the laser device LS according to an aspect of the present invention has been explained. Hereafter, a specific construction of a laser device included in this aspect is explained for each construction form. In the laser devices LS of various construction forms, the construction of the laser light generation unit 1 are different, while the constructions of the amplification unit 2 and the wavelength conversion unit 3 are the same. Accordingly, parts having different constructions are assigned auxiliary symbols A, B, C, . . . , for instance, laser light generation units 1A, 1B, 1C and control units 8A, 8B, 8C and explanation is made for each construction form.

First Construction Form

Figure 2:
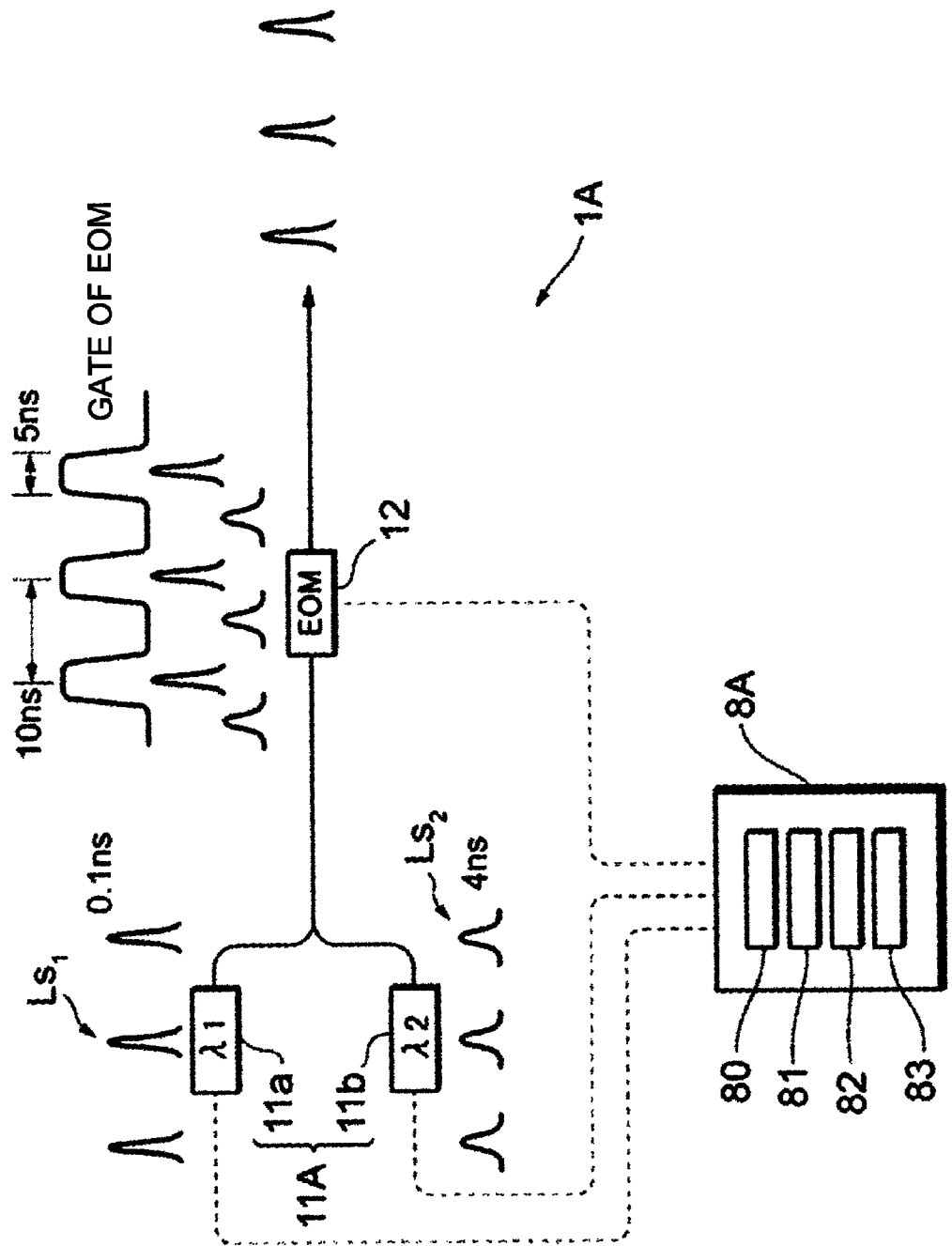
FIG. 2 is a diagram illustrating a schematic construction and operation of a laser device according to a first construction form of the present invention.

A diagram illustrating a schematic construction and an operation of a laser light generation unit 1A in a laser device according to a first construction form of the present invention is presented in FIG. 2. The laser light generation unit 1A includes a laser light source 11A and an intensity modulator 12. The laser light source 11A includes a first laser light source 11a and a second laser light source 11b.

The first laser light source 11a is a light source which generates a first seed light (a laser light in a first pulse waveform) Ls1 at the predetermined frequency f based on a first laser light source drive signal outputted from the control unit 8A. The second laser light source 11b is a light source which generates a second seed light (a laser light in a second pulse waveform) Ls2 at the same frequency f as that of the first laser light source 11a at timing different from that of the first laser light source 11a based on a second laser light source drive signal which is outputted from control unit 8A. An example of the first laser light source 11a is a DFB (Distributed Feedback Laser) semiconductor laser having an oscillation wavelength of λ1 and an example of the second laser light source 11b is a DFB semiconductor laser having an oscillation wavelength of λ2. In a first example included in the present construction form, the wavelengths are set to λ1=λ2=1064 nm.

As mentioned above, the first seed light Ls1 is a pulse laser light which is set to have a relatively high efficiency of wavelength conversion at the wavelength conversion unit 3 so as to generate ultraviolet light Lv. The second seed light Ls2 is a pulse laser light which is set to have substantially the same pulse energy as that of the first seed light Ls1 and a relatively low efficiency of wavelength conversion at the wavelength conversion unit 3 (in a state of high extinction ratio) to eliminate generation of ultraviolet light Lv.

The first seed light Ls1, which is generated by the first laser light source 11a, and the second seed light Ls2, which is generated by the second laser light source 11b, are multiplexed through a coupler or the like (not shown). The resultant seed light formed by multiplexing the first seed light Ls1 and the second seed light Ls2 (referred to as "multiplexed seed light"), enters the intensity modulator 12.

The intensity modulator 12, based on an intensity modulator drive signal which is outputted from the control unit 8A, transmits either one the first seed light Ls1 or the second seed light Ls2 from the multiplexed seed light formed by multiplexing the first seed light Ls1 and the second seed light Ls2 and outputs the transmitted light to the amplification unit 2. The waveform of the intensity modulator drive signal, more specifically, the transmittance waveform of the intensity modulator 12 is an on/off gate-like waveform in which a transmission state and a shutoff state are switched from one to another at a frequency f, which is the same as the frequency in which the first seed light and the second seed light are generated. An example of the intensity modulator 12 that can be used advantageously is, for instance, a Mach-Zehnder EO intensity modulator.

The control unit 8A includes a pulse control circuit 80, a first laser driver 81, a second laser driver 82, and an EOM driver 83. The pulse control circuit 80, on the basis of a reference clock of the control unit 8A, generates and outputs a control signal for each driver based on the preset first pulse waveform, second pulse waveform, and transmittance waveform. The first laser driver 81 generates a first laser light source drive signal at a signal level which is suitable for driving the first laser light source based on a control signal in the first pulse waveform which is outputted from the pulse control circuit 80 to drive the first laser light source 11a therewith. Similarly, the second laser driver 82 generates a second laser light source drive signal at a level which is suitable for driving the second laser light source based on a control signal in the second pulse waveform which is outputted from the pulse control circuit 80 to drive the second laser light source 11b therewith. The EOM driver 83 generates an intensity modulator drive signal at a level which suitable for driving the intensity modulator based on a control signal in the transmittance waveform which is outputted from the pulse control circuit 80 to drive the intensity modulator 12 therewith.

The laser device with such a construction form is explained hereafter by way of examples with concrete numerical values. The control signal in the first pulse waveform, the control signal in the second pulse waveform, and the control signal in the transmittance waveform, which are generated by the pulse control circuit 80, are each a stationary wave which has a frequency f of 100 MHz and which repeats the same pulse waveform at a repetition period of 10 ns. However, the control signals differ in waveform and timing from each other as mentioned below.

The first pulse waveform is a pulse waveform that has a relatively short pulse duration and relatively high peak intensity. For instance, as described in a supplementary note in FIG. 2, a pulse waveform having an on-time of about 0.1 ns and a relatively high peak intensity is stored as a preset first pulse waveform at the pulse control circuit 80. The pulse control circuit 80 generates a control signal having the first pulse waveform which is repeated at a frequency of 100 MHz. The generated control signal having the first pulse waveform is outputted to the first laser driver 81 at first timing which is counted using a predetermined time t0 as a reference. The first laser driver 81 converts this control signal into a signal at a signal level which is suitable for driving the first laser light source to drive the first laser light source 11a therewith. As a result, the laser light in a first pulse waveform having a high peak power, i.e., first seed light Ls1, is constantly outputted from the first laser light source 11a at a repetition period of 10 ns (frequency 100 MHz).

The second pulse waveform is a pulse waveform which has a relatively long pulse duration and a relatively low peak intensity. For instance, as shown in the drawings, a pulse waveform having an on-time of about 4 ns and a relatively low peak intensity is stored at the pulse control circuit 80 as a preset second pulse waveform. The pulse control circuit 80 generates a control signal in the second pulse waveform which is repeated at a frequency of 100 MHz. The pulse control circuit 80 outputs the generated control signal having the second pulse waveform to the second laser driver 82 at a second timing counted from the predetermined time t0 taken as a reference. In this case, the outputting timing of the control signal in the first pulse waveform and the outputting timing of the control signal in the second pulse waveform are set different from each other. This is because the first seed light Ls1 and the second seed light Ls2 after multiplexing will not timewise overlap each other and be separated timewise from each other at the intensity modulator 12.

In the present example, the control signal in the first pulse waveform and the control signal in the second pulse waveform are set to be shifted relative to each other by 5 ns, i.e., by half the repetition period. The second laser driver 82 converts the control signal which is set in this manner into a control signal with a signal level which is suitable for driving the second laser light source, and outputs a second laser light source drive signal to drive the second laser light source 11b therewith. As a result, the second seed light Ls2 having a relatively low peak power is constantly outputted from the second laser light source 11b at a repetition period of 10 ns (frequency of 100 MHz), which is the same as the repetition period of the first seed light Ls1, but at light emission timing which is shifted by 5 ns from the light emission timing of the first seed light Ls1.

The first seed light Ls1, which is outputted from the first laser light source 11a, and the second seed light Ls2, which is outputted from the second laser light source 11b, are multiplexed through a coupler or the like and the resultant multiplexed seed light which is formed by multiplexing the first seed light Ls1 and the second seed light Ls2 enters the intensity modulator 12. In this case, the pulse string of the first seed light Ls1 and the pulse string of the second seed light Ls2 have the same repetition period of 10 ns but their light emission timing is shifted by 5 ns from each other. As a result, the multiplexed seed light that enters the intensity modulator 12 has a pulse waveform in which the first seed light Ls1 and the second seed light Ls2 are each repeated alternately at a period of 5 ns.

The transmittance waveform is an on/off gate-like waveform in which a transmission state in which the seed light is transmitted and a shutoff state in which the seed light is shutoff are switched from one to another. For instance, as described in the supplementary note in FIG. 2, a rectangular waveform having an on-time (transmission state) of about 5 ns is stored as a preset waveform at the pulse control circuit 80. The pulse control circuit 80 generates a control signal of the transmittance waveform which is repeated at a frequency of 100 MHz, which is the same as the frequency of the first pulse waveform and the second pulse waveform (that is, rectangular wave-like signal with 5 ns transmittance state and 5 ns shutoff state). Then, the pulse control circuit 80 outputs the generated control signal in the transmittance waveform to the EOM driver 83 at first timing or at second timing, which is counted from the predetermined time t0 taken as a reference depending on the on/off pattern of ultraviolet light (output light). The EOM driver 83, based on the control signal in the transmittance waveform which is outputted from the pulse control circuit 80, outputs an intensity modulator drive signal at a signal level which is suitable for driving the intensity modulator to drive the intensity modulator 12 therewith.

For instance, it is assumed that based on a processing program or the like at a system such as an exposure device, an output command of a predetermined on/off pattern is inputted into the control unit 8A. In this case, the pulse control circuit 80 outputs a control signal of the transmittance waveform at first timing counted from the predetermined time t0 taken as a reference to the EOM driver 83 while the output command is in an on state. On the other hand, the pulse control circuit 80 outputs a control signal of the transmittance waveform to the EOM driver 83 at second timing counted from the predetermined time t0 taken as a reference while the output command is in an off state. The first timing is output timing which is the same as that of the control signal in the first pulse waveform and the second timing is output timing which is the same as that of the control signal in the second pulse waveform.

As a result, for the multiplexed seed light formed by multiplexing the first seed light Ls1 and the second seed light Ls2, which alternately enter the intensity modulator 12, while the output command is in an on state, the timing at which the first seed light Ls1 enters the intensity modulator 12 coincides with the timing at which the intensity modulator 12 comes to be in a transmission state and the timing at which the second seed light Ls2 enters the intensity modulator 12 coincides with the timing at which the intensity modulator 12 comes to be in a shutoff state. As a result, the intensity modulator 12 outputs a pulse string of the first seed light Ls1. On the other hand, while the output command is in the off state, the timing at which the second seed light Ls2 enters the intensity modulator 12 coincides with the timing at which the intensity modulator 12 comes to be in a transmission state and the timing at which the first seed light Ls2 enters the intensity modulator 12 coincides with the timing at which the intensity modulator 12 comes to be in a shutoff state. As a result, the intensity modulator 12 outputs a pulse string of the second seed light Ls2.

Instead of the intensity modulator 12, an optical switch which has two input ports and one output port and which selectively outputs either one of inputs to the input ports (EO optical switch or the like) may also be used. In this case, the first seed light Ls1 is inputted to one of the input ports (input port 1) and the second seed light Ls2 is inputted to the other of the input ports (input port 2) at the same timing without any element, such as a coupler, for combining the lights. The drive signal for an optical switch may be of a rectangular waveform identical to that used at the intensity modulator 12 (for both the state in which the input port 1 is selected and the state in which the input port 2 is selected, 5 ns). Shifting by 5 ns the timing at which the drive signal for the optical switch is inputted enables either the first seed light Ls1 or the second seed light Ls2 to be outputted from the optical switch through the input port 1 or the input port 2, respectively.

The pulse string of the first seed light Ls1 which is outputted from the intensity modulator 12 while the output command is in an on state and the pulse string of the second seed light Ls2 which is outputted form the intensity modulator 12 while the output command is in the off state are inputted into the amplification unit 2 and amplified by the fiber amplifier 21. The first seed light Ls1 and the second seed light Ls2 are set to have different pulse waveforms from each other and have substantially the same pulse energy. According to the output command, either the pulse string of the first seed light Ls1 having a frequency of 100 MHz or the pulse string of the second seed light Ls2 having a frequency of 100 MHz is constantly inputted to the fiber amplifier 21. As a result, the inverted distribution state of Yb atoms at the fiber amplifier 21 can be always maintained constant regardless of whether the output command is in an on state or in the off state, or regardless of how the time duration of the on state and the time duration of the off state are allocated.

Into the wavelength conversion unit 3, a first amplified light which is obtained by amplifying the first seed light Ls1 is inputted while the output command is in the on state, and a second amplified light that is obtained by amplifying the second seed light Ls2 while the output command is in the off state. The pulse energy of the first seed light Ls1 and that of the second seed light Ls2 are set to be substantially the same. Thus, the first amplified light and the second amplified light have the same pulse energy but different pulse waveforms from each other. That is, the first amplified light is a high peak power pulse light which has a pulse duration of about 0.1 ns and relatively high peak power. The second amplified light is a relatively low peak power pulse light that has a pulse duration of about 4 ns and relatively low peak power. If both the pulse lights are set to have the same pulse energy, the peak power of the second amplified light is about $1/40$ times the peak power of the first amplified light.

The efficiency of wavelength conversion at the wavelength conversion optical elements 31, 32 largely depends on the peak power of amplified light that is the subject of the wavelength conversion provided that phase matching conditions are satisfied. For instance, the efficiency η of wavelength conversion for generating a third harmonic at the wavelength conversion optical element 32 is approximately proportional to a square of the peak power Pp of the amplified light ($\eta \propto Pp2$). Consequently, the wavelength of the first amplified light, which has high peak power, is converted at a high conversion efficiency to generate ultraviolet light Lv having a wavelength of 355 nm. On the other hand, for the second amplified light, which has low peak power, the efficiency η of wavelength conversion is $1/1000$ or fewer times the efficiency of wavelength conversion for the first amplified light and substantially no ultraviolet light having a wavelength of 355 nm is generated. That is, setting the first pulse waveform and the second pulse waveform as mentioned above enables high extinction ratio of about 1:1000 to be achieved by using a difference in peak power ΔPp of the amplified light.

In the first example as described above, a pulse light having a relatively narrow pulse duration and relatively high peak power is exemplified as the first seed light Ls1 and a pulse light having the same pulse energy as that of the first seed light Ls1 and a relatively wide pulse duration and relatively low peak power is exemplified as the second seed light Ls2. That is, in the present example, a construction is exemplified, in which use is made of a difference in height of peak power as means for forming the first seed light Ls1, the wavelength of which is converted at a relatively high efficiency at the wavelength conversion unit 3, and the second seed light Ls2, the wavelength of which is converted at a relatively low efficiency at the wavelength conversion unit 3, thereby enabling the output light, i.e., ultraviolet light, to be turned on/off. However, the first seed light Ls1 and the second seed light Ls2 may be formed by other means.

As a second example exemplifying the other means mentioned above, a construction is exemplified in which the wavelength λ1 of the first seed light Ls1, which is emitted by the first laser light source 11a, and the wavelength λ2 of the second seed light Ls2, which is emitted by the second laser light source 11b, are set to be different from each other and a difference in wavelength $\Delta\lambda = |\lambda 1 - \lambda 2|$ is used to turn on/off the ultraviolet light, which is the output light. In this case, the first seed light Ls1 which is emitted from the first laser light source 11a is a pulse light having a wavelength λ1=1064 nm, for which the phase matching conditions are satisfied at the wavelength conversion optical element 31, 32 (the efficiency η of conversion of the wavelength of light is relatively high). On the other hand, the second seed light Ls2 which is emitted from the second laser light source 11b is a pulse light with a wavelength λ2 which light has the same pulse energy as that of the first seed light Ls1, but does not satisfy the phase matching conditions at the wavelength conversion optical elements 31, 32 (with the efficiency of η of conversion of the wavelength of light being relatively low).

Specifically, the wavelength λ2 of the second seed light Ls2 is set so that an extinction ratio of 1:100 (more preferably 1:1000 or more) with respect to ultraviolet light which is generated by wavelength conversion of the first amplified light is accomplished. For instance, a wavelength difference Δλ from the wavelength λ1 of the first seed light Ls1 is set to be about 10 nm. The pulse waveform of the first seed light Ls1 and the pulse waveform of second seed light Ls2 may be the same or different in so far as they have the same pulse energy.

As a third example exemplifying the other means, a construction is exemplified in which a polarization plane at which the first amplified light, which is emitted from the first laser light source 11a and amplified at the fiber amplifier 21, enters the wavelength conversion optical element 31 and a polarization plane at which the second amplified light, which is emitted from the second laser light source 11b and amplified at the fiber amplifier 21, enters the wavelength conversion optical elements 31 are set at different angular positions from each other, and use is made of a difference in angle between the polarization planes to turn on/off the output light, i.e., ultraviolet light. For instance, for the first amplified light which is emitted from the first laser light source 11a and amplified at the fiber amplifier 21, the polarization plane is set so that the phase matching conditions at the wavelength conversion optical elements 31, 32 are satisfied (the efficiency η of wavelength conversion is relatively high). On the other hand, for the second amplified light that is emitted from the second laser light source 11b and amplified at the fiber amplifier 21, the polarization plane is set so that the phase matching conditions are not satisfied at the wavelength conversion optical element 31, 32 (the efficiency η of wavelength conversion is relatively low).

Specifically, for the second amplified light, the polarization plane is set so that an extinction ratio of 1:100 or more (preferably 1:1000 or more) with respect to the ultraviolet light which is generated by converting the wavelength of the first amplified light is accomplished. For instance, the polarization plane of the first amplified light and the polarization plane of the second amplified light are set so that they are at right angles with respect to each other. The pulse waveform of the first seed light Ls1 and the pulse waveform of the second seed light Ls2 may be the same or different in so far as they have the same pulse energy.

As a fourth example exemplifying the other means, constructions in which the first to the third examples are combined in any appropriate combinations are exemplified. For instance, a height difference ΔPp between the peak powers Pp of the first seed light Ls1 and the second seed light Ls2 is used and also a difference Δλ in oscillation wavelength λ, between the first seed light Ls1 and the second seed light Ls2 is used. This enables the extinction ratio of ultraviolet light to be increased greatly and effectively as compared with respective examples separately.

The laser device according to the present construction form explained above, in which the first laser light source 11a and the second laser light source 11b can be operated in a completely stationary state, can oscillate stably. To the fiber amplifier 21, is always inputted either the first seed light Ls1 or the second seed light Ls2, both of which have the same pulse energy. This enables the inverted distribution state to be maintained constant and stable amplified light to be obtained.

Consequently, the laser device according to the present construction form, with a very simple construction to shift the gate-like transmittance waveform which is outputted from the pulse control circuit 80 in the direction of time axis according to the on/off pattern of the output command, enables switching laser lights very stably and at high speed on pulse-to-pulse basis, and outputs ultraviolet light having any desired waveform, ranging from a pulse string having a relatively long on-time to a pulse string having a relatively short on-time.

Second Construction Form

Figure 3:
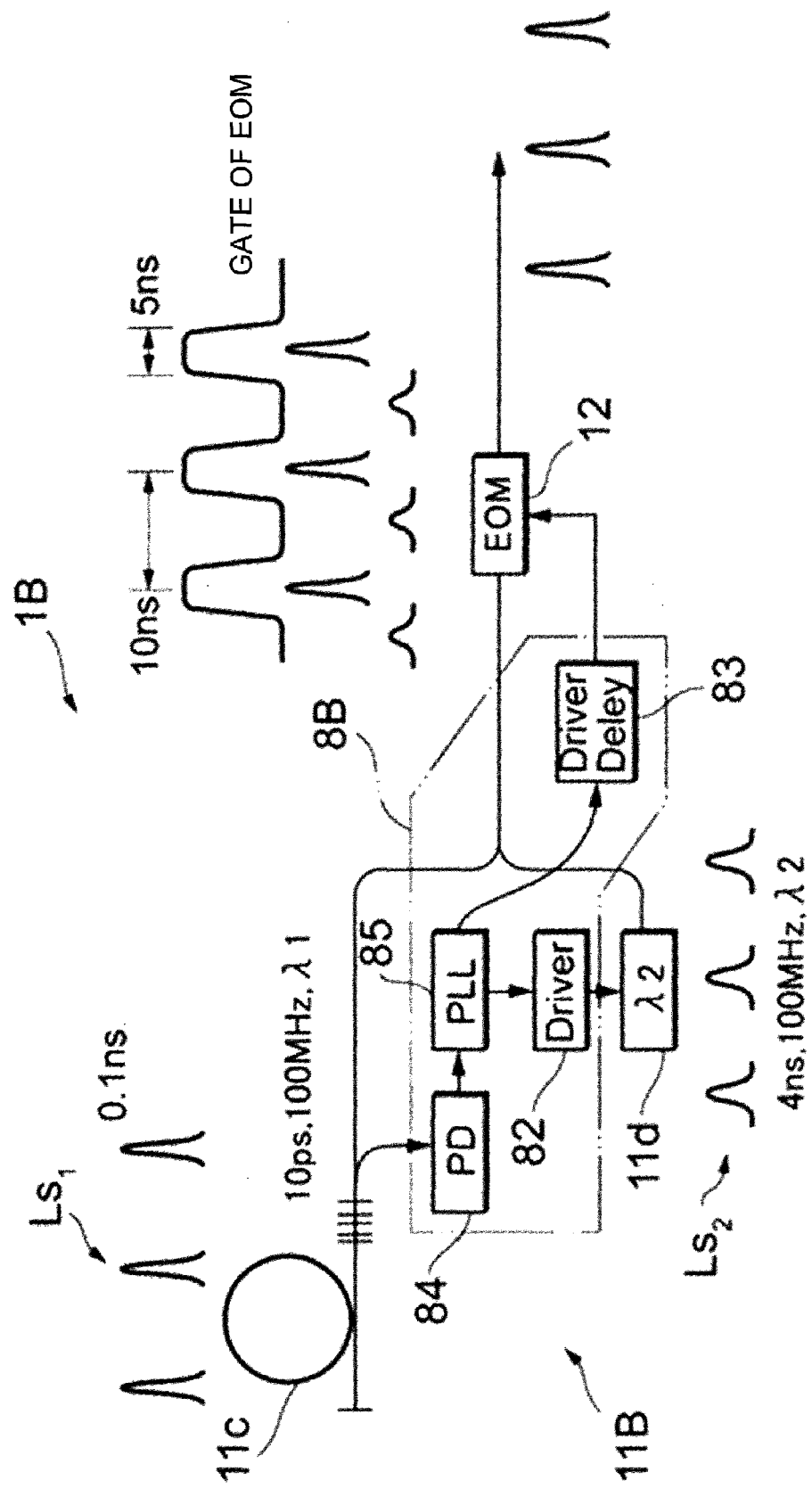
FIG. 3 is a diagram illustrating a schematic construction and operation of a laser light generation unit in a laser device according to a second construction form of the present invention.

A diagram illustrating a schematic construction and operation of a laser light generation unit 1A in a laser device according to a second construction form of the present invention is presented in FIG. 3. The laser light generation unit 1B includes a laser light source 11B and an intensity modulator 12. The laser light source 11B includes a first laser light source 11c and a second laser light source 11d. The same or similar components as those in the laser device according to the first construction form are assigned the same reference symbols and terms, respectively.

The first laser light source 11c is a light source that autonomously generates a first seed light (laser light in a first pulse waveform) Ls1 at a predetermined frequency f that has been preadjusted and preset. The second laser light source 11d is a light source that has the same frequency f as that of the first laser light source 11c but generates a second seed light (laser light in a second pulse waveform) Ls2 at different timing as that of the first laser light source 11c. The first laser light source 11c that can be advantageously used is a mode-locked laser having an oscillation wavelength of λ1 and as the second laser light source 11d that can be advantageously used is a DFB semiconductor laser having an oscillation wavelength of λ2. In a first example included in the present construction form, the oscillation wavelengths are set λ1=λ2=1064 nm.

The first seed light Ls1 and the second seed light Ls2 are the same as those used in the construction form mentioned above. That is, the first seed light Ls1 is a laser light with a relatively short pulse duration and relatively high peak power, having a relatively high efficiency of wavelength conversion at the wavelength conversion unit 3. The second seed light Ls2 is a laser light with a relatively long pulse duration and relatively low peak power, having substantially the same pulse energy as that of the first seed light Ls1 and a relatively low efficiency of wavelength conversion at the wavelength conversion unit 3.

Using a mode-locked laser as the first laser light source 11c enables generation of the first seed light Ls1 having a pulse duration on the order of ps and a relatively high peak power at a relatively high repetition frequency f. It is assumed that the first amplified light, which is obtained by amplifying the first seed light Ls1 which is outputted from the first laser light source 11c, has an average power output of Pa (W), peak power of Pp (W), a pulse duration of τ(sec), and a repetition frequency f of R (Hz). Then there is given a relationship Pa=τ×R×Pp. As mentioned above, to achieve a relatively high conversion efficiency η at each of the wavelength conversion optical elements 31, 32, it is efficient to increase the peak power Pp. It is preferred to set the peak power to a value of, for instance, about 10 kW or more. The mode-locked laser allows the pulse duration τ thereof to be set at a level of ps. This enables a pulse light having a high peak power to be generated at a repetition frequency f. For instance, the first amplified light has an average power output Pa of 10 W, a repetition frequency f of 100 MHz and a pulse duration τ of 10 ps.

The first seed light Ls1, which is generated at the first laser light source 11c, and the second seed light Ls2, which is generated at the second laser light source 11d, are multiplexed through a coupler or the like (not shown). The resultant seed light which is formed by multiplexing the first seed light Ls1 and the second seed light Ls2 (multiplexed seed light), enters the intensity modulator 12.

The intensity modulator 12, based on an intensity modulator drive signal which is outputted from the control unit 8B, transmits either one the first seed light Ls1 or the second seed light Ls2 from the multiplexed seed light, which is formed by multiplexing the first seed light Ls1 and the second seed light Ls2, and outputs the transmitted light to the amplification unit 2. The waveform of the intensity modulator drive signal, more specifically, the transmittance waveform of intensity modulator 12 is an on/off gate-like waveform in which a transmission state and a shutoff state are switched from one to another in the frequency f, which is the same as the frequency in which the first seed light and the second seed light are generated. The intensity modulator 12 which can be used advantageously is a Mach-Zehnder EO intensity modulator.

In this regard, the mode-locked laser used as the first light source 11c autonomously oscillate at a predetermined frequency f based on the operation principle. Thus, the control unit 8B is constructed to cause the second laser light source 11d and the intensity modulator 12 to operate in synchronization with the first seed light Ls1 which is outputted from the first laser light source 11c.

The control unit 8B includes a photodetector 84, a pulse synchronization control circuit 85, a second laser driver 82, and an EOM driver 83. The photodetector 84 extracts a portion of the light (for instance, several %) which is outputted from the first laser light source 11c to monitor the state of operation of the first laser light source 11c. Then, at the time when the first seed light Ls1 is detected, the photodetector 84 outputs a pulse detection signal to the pulse synchronization control circuit 85. The pulse synchronization control circuit 85 generates a control signal of the second pulse waveform for driving the second laser driver 82 and a control signal of the transmittance waveform for driving the EOM driver 83 based on the preset second pulse waveform on the basis of the pulse detection signal as a reference and outputs the generated control signals.

The second laser driver 82 generates a second laser light source drive signal at a signal level which is suitable for driving the second laser light source 11*d* based on a control signal of the second pulse waveform which is outputted from the pulse synchronization control circuit 85 to drive the second laser light source 11*d* therewith. The EOM driver 83 generates an intensity modulator drive signal at a signal level which is suitable for driving the intensity modulator based on a control signal of the transmittance waveform which is outputted from the pulse synchronization control circuit 85 to drive the intensity modulator 12 therewith.

The laser device of such a construction form as described above is explained hereafter by way of examples with concrete numerical values. The waveform of the first seed light Ls1 which is outputted from the first laser light source 11*c* (first pulse waveform) is a pulse waveform having a relatively short pulse duration and relatively high peak power. For instance, as described in the supplementary note in FIG. 3, a pulse light having an on-time of about 10 ps and a relatively high peak intensity is autonomously outputted at a preadjusted and preset repetition frequency of 100 MHz.

The pulse synchronization control circuit 85 generates a clock having a frequency of 100 MHz on the basis of a detection-time t1 as a reference based on the pulse detection signal which is outputted from the photodetector 84. In the present embodiment, the timing that coincides with the timing at which the first seed light Ls1 is outputted on the basis of the detection-time t1 of the pulse light as a reference is referred to as "first timing".

The pulse synchronization control circuit 85 stores a preset second pulse waveform which has a relatively long pulse duration and a relatively low peak intensity. The second pulse waveform is set so that the second seed light Ls2, which is generated when the second laser light source 11*d* is operated, has pulse energy that is substantially the same as the pulse energy of the first seed light Ls1, which is outputted from the first laser light source. For instance, as shown in the figure, a pulse waveform having an on-time of about 4 ns and a relatively low peak intensity is set and stored as the second pulse waveform.

The pulse synchronization control circuit 85 generates a control signal in the second pulse waveform which is repeated at the same frequency (100 MHz) taking the clock on the basis of the pulse detection signal as a reference. Then, the pulse synchronization control circuit 85 outputs the generated control signal of the second pulse waveform to the second laser driver 82 at second timing which is different from the first timing at which the first seed light Ls1 is turned on. The timing at which the first seed light Ls1 is detected is made different from the timing at which the control signal of the second pulse waveform is outputted. This is contemplated to separate the first seed light Ls1 and the second seed light Ls2 after multiplexing these lights so that they will not overlap timewise at the intensity modulator 12.

In the present example, the timewise shift between the first timing and the second timing is set to 5 ns, i.e., half the repetition period of the first seed light Ls1. The second laser driver 82 converts the control signal which is set in this manner to have a signal level which is suitable for driving the second laser light source and outputs a second laser light source drive signal to drive the second laser light source 11*d* therewith. As a result, the second laser light source 11*d* constantly outputs the second seed light Ls2 having relatively low peak power, which has the same repetition period of 10 ns (frequency of 100 MHz) as that of the first seed light Ls1, with the timing at which the second seed light Ls1 is emitted being shifted by 5 ns from the timing at which the first seed light Ls1 is emitted.

The first seed light Ls1, which is outputted from the first laser light source 11*c*, and the second seed light Ls2, which is outputted from the second laser light source 11*d*, are multiplexed through a coupler or the like, and the multiplexed seed light enters the intensity modulator 12. In this case, the pulse string of the first seed light Ls1 and the pulse string of the second seed light Ls2 have the same repetition period of 10 ns but they are emitted at timing shifted by 5 ns one from another. As a result, the multiplexed seed light which enters the intensity modulator 12 has a pulse waveform in which the first seed light Ls1 and the second seed light Ls2 are alternately repeated at a period of 5 ns.

The pulse synchronization control circuit 85 stores a preset on/off gate-like transmittance waveform having a transmission state in which the seed light is transmitted and a shutoff state in which the seed light is shutoff, which can be alternately switched. For instance, as described in a supplementary note in FIG. 3, it stores a preset square wave-like waveform having an on-time of about 5 ns. The pulse synchronization control circuit 85 generates a control signal of the transmittance waveform, which has the same repetition frequency as that of the clock (100 MHz), which is based on the clock on the basis of the pulse detection signal and taken as a reference. Then, the pulse synchronization control circuit 85 outputs the generated control signal of the transmittance waveform to the EOM driver 83 either at first timing or at second timing counted from the predetermined time t1 taken as a reference according to the on/off pattern of ultraviolet light (output light). The EOM driver 83, based on the control signal of the transmittance waveform which is outputted from the pulse synchronization control circuit 85, outputs an intensity modulator drive signal at a signal level which is suitable for driving the intensity modulator to drive the intensity modulator 12 therewith.

Subsequently, the on/off control of the output light which is based on a processing program, etc. is performed in the same manner as that in the above-mentioned embodiment. That is, the pulse synchronization control circuit 85 outputs a control signal of the transmittance waveform at first timing to the EOM driver 83 in a state in which the output command is on and outputs a control signal of the transmittance waveform to the EOM driver 83 at second timing in a state in which the output command is off. The first timing is timing which is the same as the timing at which the first seed light Ls1 is outputted. The second timing is timing which is the same as the timing at which the second seed light Ls2 is outputted.

As a result, for the multiplexed seed light with the first seed light Ls1 and the second seed light Ls2 alternately enter the intensity modulator 12, while the output command is in an on state, the timing at which the first seed light Ls1 enters the intensity modulator 12 coincides with the timing at which the intensity modulator 12 is in a transmission state and the timing at which the second seed light Ls2 enters the intensity modulator 12 coincides with the timing at which the intensity modulator 12 is in a shutoff state. This causes the intensity modulator 12 to output a pulse string of the first seed light Ls1. On the other hand, while the output command is in an off state, the timing at which the second seed light Ls2 enters the intensity modulator 12 coincides with the timing at which the intensity modulator 12 is in a transmission state and the timing at which the first seed light Ls1 enters the intensity modulator 12 coincides with the timing at which the intensity modulator 12 is in a shutoff state. This causes the intensity modulator 12 to output a pulse string of the second seed light Ls2.

The pulse string of the first seed light Ls1 which is outputted from the intensity modulator 12 while the output command is in the on state and the pulse string of the second seed light Ls2 which is outputted from the intensity modulator 12 while the output command is in the off state are inputted into the amplification unit 2 and are amplified through the fiber amplifier 21. The first seed light Ls1 and the second seed light Ls2 have different pulse waveforms from each other but they have substantially the same pulse energy. To the fiber amplifier 21 is constantly inputted either the pulse string of the first seed light Ls1 having a frequency of 100 MHz or the pulse string of the second seed light Ls2 having a frequency of 100 MHz according to the output command. This enables the inverted distribution state of Yb atoms at the fiber amplifier 21 to be always maintained constant regardless of whether the output command is in the on state or in the off state, or regardless of how the time duration of the on state and the time duration of the off state are allocated.

Into the wavelength conversion unit 3 is input the first amplified light, which is obtained by amplifying the first seed light Ls1, while the output command is in the on state and the second amplified light which is obtained by amplifying the second seed light Ls2 while the output command is in the off state. The first amplified light and the second amplified light have the same pulse energy but have different pulse waveforms from each other. That is, the first amplified light is a high peak power pulse light which has a pulse duration of about 10 ps and relatively high peak power. The second amplified light is a low peak power pulse light that has a pulse duration of about 4 ns and relatively low peak power. Assuming that both the pulse lights are set to have the same pulse energy, the peak power of the second amplified light is about 1/400 times the peak power of the first amplified light.

As mentioned above, the efficiency η of wavelength conversion for generating a third harmonic at the wavelength conversion optical element 32 is substantially proportional to a square of the peak power Pp of the amplified light. Consequently, the wavelength of the first amplified light, which has relatively high peak power, is converted at a relatively high conversion efficiency to generate ultraviolet light Lv having a wavelength of 355 nm. On the other hand, the second amplified light, which has relatively low peak power, has an efficiency η of wavelength conversion $1/10^5$ or fewer times the efficiency of wavelength conversion for the first amplified light and generates substantially no ultraviolet light having a wavelength of 355 nm. That is, setting the first pulse waveform and the second pulse waveform as mentioned above enables very high extinction ratio to be achieved by using a difference in peak power ΔPp of the amplified light.

In the first example as described above, a pulse light having a relatively narrow pulse duration and relatively high peak power is exemplified as the first seed light Ls1 and a pulse light having the same pulse energy as that of the first seed light Ls1 and a relatively wide pulse duration and relatively low peak power is exemplified as the second seed light Ls2. That is, in the present example, a construction is exemplified, in which use is made of a difference in height of peak power as means for forming the first seed light Ls1, the wavelength of which is converted at a relatively high efficiency at the wavelength conversion unit 3, and the second seed light Ls2, the wavelength of which is converted at a relatively low efficiency at the wavelength conversion unit 3, to turn on/off the output light which is ultraviolet light. However, the first seed light Ls1 and the second seed light Ls2 may be formed by other means.

As a second example, a construction is exemplified in which the wavelength λ1 of the first seed light Ls1 which is emitted by the first laser light source 11c and the wavelength λ2 of the second seed light Ls2 which is emitted by the second laser light source 11d are set to be different from each other and a difference in wavelength Δλ=|λ1−λ2| is used to turn on/off the ultraviolet light, which is output light. Specifically, the wavelength λ2 of the second seed light Ls2 is set to have an extinction ratio of 1:100 (more preferably 1:1000 or more) with respect to ultraviolet light which is generated by converting the wavelength of the first amplified light. For instance, the wavelength λ1 difference Δλ of the wavelength λ2 of the second seed light Ls2 from the wavelength λ1 of the first seed light Ls1 is set to about 10 nm. The pulse waveform of the first seed light Ls1 and the pulse waveform of second seed light Ls2 may be the same or different if they have the same pulse energy.

As a third example, a construction is exemplified in which a polarization plane at which the first amplified light enters the wavelength conversion optical element 31 and a polarization plane at which the second amplified light enters the wavelength conversion optical element 31 are set to take different angular positions from each other, and use is made of a difference in angle between the polarization planes to turn on/off ultraviolet light, which is output light. Specifically, the second amplified light has a polarization plane which is set so that an extinction ratio of 1:100 or more is achieved (preferably 1:1000 or more) with respect to the ultraviolet light which is generated by converting the wavelength of the first amplified light. For instance, the polarization plane of the first amplified light and the polarization plane of the second amplified light are set so that they are at right angles with respect to each other. The pulse waveform of the first seed light Ls1 and the pulse waveform of the second seed light Ls2 may be the same or different in so far as they have the same pulse energy.

As a fourth example exemplifying the other means, a constructions in which the first to the third examples are combined as appropriate are exemplified. For instance, a difference in height ΔPp between the peak powers Pp of the first seed light Ls1 and the second seed light Ls2 is used and also a difference Δλ in oscillation wavelength λ between the first seed light Ls1 and the second seed light Ls2 is used. This enables the extinction ratio of ultraviolet light to be increased greatly and effectively as compared with respective examples separately.

In the laser device according to the present construction form explained above, the first laser light source 11c is operated in a completely stationary state. Also, the second laser light source 11d is operated in a completely stationary state pursuant to this, so that the laser device can achieve stable oscillation. To the fiber amplifier 21 is always inputted either one of the first seed light Ls1 and the second seed light Ls2, both of which have the same pulse energy. This enables the inverted distribution state to be maintained constant and enables stable amplified light to be achieved.

Consequently, the laser device according to the present construction form, with a very simple construction to shift the gate-like transmittance waveform which is outputted from the pulse synchronization control circuit 85 in the direction of time axis according to the on/off pattern of the output command, enables switching laser lights very stably and at high speed on pulse-to-pulse basis, and outputs ultraviolet light having any desired waveform, ranging from a pulse string having a relatively long on-time to a pulse string having a relatively short on-time.

Third Construction Form

Figure 4:
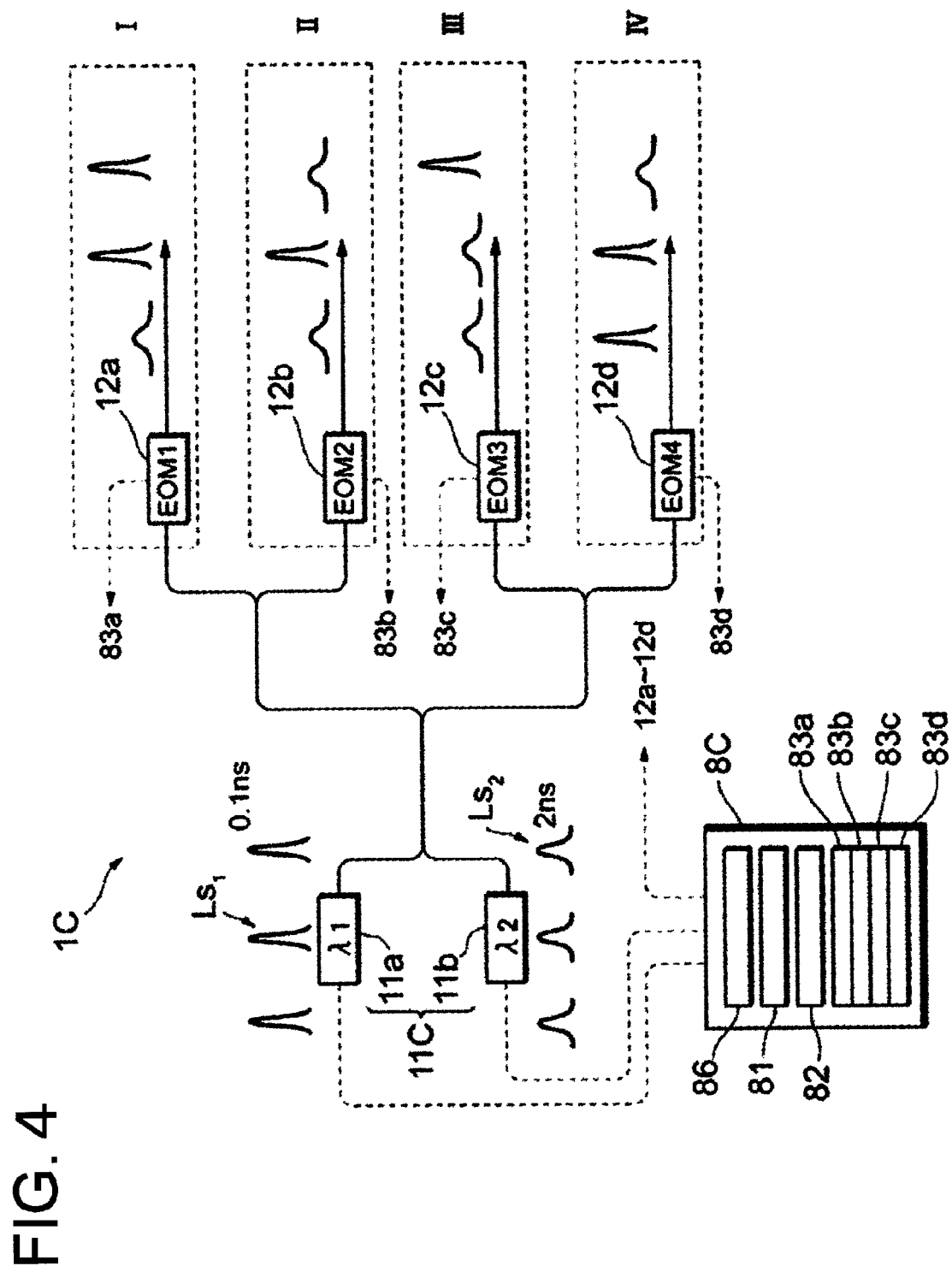
FIG. 4 is a diagram illustrating a schematic construction and operation of a laser light generation unit in a laser device according to a third construction form of the present invention.

A diagram illustrating a schematic construction and operation of a laser light generation unit 1C in a laser device according to a third construction form of the present invention is presented in FIG. 4. The laser device according to the present construction form is configured to divide the laser light which is outputted from the laser light source 11C into a plurality of lights and to include a plurality of wave length conversion optical systems 30 arranged in parallel, each including an intensity modulator 12, a fiber amplifier 21, and wavelength conversion optical elements 31, 32, with the number of the optical systems 30 corresponding to the number of divided lights to enable ultraviolet light to be outputted from the systems 30 in any desired on/off patterns, respectively. FIG. 4 illustrates an example in which the number of divided lights is set to 4. As already mentioned, components that are the same as or similar to those of the laser devices according to the first and second construction forms are assigned the same reference signs and redundant explanations are omitted.

The laser light source 11C includes a first laser light source that outputs a first seed light Ls1 having a relatively high efficiency of wavelength conversion at the wavelength conversion unit 3 and a second laser light source that outputs a second seed light Ls2 having a relatively low efficiency of wavelength conversion at the wavelength conversion unit 3. Such a laser light source 11C may be either the laser light source 11A according to the first construction form or the laser light source 11B according to the second construction form, both of the laser light sources are already mentioned above. In the present embodiment, explanation is made on the case in which the laser light source 11C includes the first laser light source 11a and the second laser light source 11b in the same manner as that in the laser light source 11A according to the first construction form.

The first seed light Ls1 which is outputted from the first laser light source 11a and the second seed light Ls2 which is outputted from the second laser light source 11b are multiplexed through a coupler or the like. The generated multiplexed seed light is equally branched into $2^n$ (n is an integer of 1 or more) through a plurality of branching couplers or a star coupler, or the like. According to the present construction form, a construction is shown in which two branching couplers are provided in series to equally divide the multiplexed seed light into four paths.

In each branch optical path is provided an intensity modulator 12 (a first intensity modulator 12a, a second intensity modulator 12b, a third intensity modulator 12c, or a fourth intensity modulator 12d). The four branched groups are each provided with a fiber amplifier 21 and a wavelength conversion optical system 30 (wavelength conversion optical elements 31, 32), detailed illustration of which is omitted. That is, the amplification unit 2 is provided with four fiber amplifiers 21 in parallel and the wavelength conversion unit 3 is provided with four wave length conversion optical systems 30 in parallel.

The control unit 8C includes a pulse control circuit 86, a first laser driver 81, a second laser driver 82, and first to fourth EOM drivers 83a to 83d corresponding to first to fourth intensity modulators 12a to 12d, respectively. The pulse control circuit 86 generates a control signal for each driver on the basis of the reference clock of the control unit 8C as a reference and based on the first pulse waveform, the second pulse waveform, and the transmittance waveform, which are preset, and outputs the generated control signals.

Hereafter, explanation of the laser device according to the present construction form is made by way of examples with concrete numerical values. The control signal of the first pulse waveform, the control signal of the second pulse waveform, and the control signal of the transmittance waveform, which are generated by the pulse control circuit 86, are each a stationary wave having a frequency f of 100 MHz, in which the same pulse waveform is repeated at a repetition period of 10 ns. However, the control signals differ in waveform and timing from each other as explained below.

The first pulse waveform is a pulse waveform having a relatively short pulse duration and a relatively high peak intensity. For instance, as described in a supplementary note in FIG. 4, a pulse waveform having an on-time of about 0.1 ns and a relatively high peak intensity is preset and stored at the pulse control circuit 86 as a first pulse waveform. The pulse control circuit 86 generates a control signal of the first pulse waveform which is repeated at a frequency of 100 MHz. Then, it outputs the generated control signal of the first pulse waveform to the first laser driver 81 at first timing on the basis of a predetermined time t0 as a reference. The first laser driver 81 converts this control signal to a control signal which has a signal level suitable for driving the first laser light source to form a first laser light source drive signal and outputs the first laser light source drive signal to the first laser light source 11a to drive it therewith. As a result, the laser light in the first pulse waveform having relatively high peak power, i.e., the first seed light Ls1 is constantly outputted from the first laser light source 11a at a repetition period of 10 ns (frequency of 100 MHz).

The second pulse waveform is a pulse waveform having a relatively long pulse duration and a relatively low peak intensity. For instance, as shown in the figure, a pulse waveform having an on-time of about 2 ns and a relatively low peak intensity is preset and stored at the pulse control circuit 86 as a second pulse waveform. The pulse control circuit 86 generates a control signal having a second pulse waveform which is repeated at a frequency of 100 MHz. Then, it outputs the generated control signal of the second pulse waveform to the second laser driver 82 at second timing on the basis of a predetermined time t0 as a reference. The timing at which the first control signal in the first pulse waveform is outputted is made different from the timing at which the control signal of the second pulse waveform is outputted. This is contemplated to separate the first seed light Ls1 and the second seed light Ls2 after multiplexing them so that they will not overlap timewise at the first to fourth intensity modulators 12a to 12d.

In the present example, the control signal of the first pulse waveform and the control signal of the second pulse waveform are set so that they are shifted with respect each other by 5 ns, i.e., by half the repetition period. The second laser driver 82 converts the control signals to a control signal having a signal level suitable for driving the second laser light source to form a second laser light source drive signal and outputs the second laser source drive signal to the second laser light source 11b to drive it therewith. As a result, the second laser light source 11b constantly outputs the second seed light Ls2 having relatively low peak power, which has the same repetition period of 10 ns (frequency of 100 MHz) as that of the first seed light Ls1, with the timing at which the second seed light Ls2 is emitted being shifted by 5 ns from the timing at which the first seed light Ls1 is emitted.

The first seed light Ls1 which is outputted from the first laser light source 11a and the second seed light Ls2 which is outputted from the second laser light source 11b are multiplexed with a coupler or the like to generate multiplexed seed light formed by multiplexing the first seed light Ls1 and the second seed light Ls2. The generated multiplexed seed light is divided into four with equal intensities through two stages of branching couplers and the same multiplexed seed lights enter a first intensity modulator 12a, a second intensity modulator 12b, a third intensity modulator 12c, and a fourth intensity modulator 12d, respectively. In this case, the pulse string of the first seed light Ls1 and the pulse string of the second seed light Ls2 have the same repetition period of 10 ns but their light emission timing is shifted by 5 ns from each other. As a result, each multiplexed seed light which enters the first to fourth intensity modulators 12a to 12d has a pulse waveform in which the first seed light Ls1 and the second seed light Ls2 are alternately repeated at a period of 5 ns.

The transmittance waveform, which is the same as the above-mentioned transmittance waveform, is an on/off gate-like waveform in which a transmission state that allows transmission of the seed light and a shutoff state that shuts off the seed light are switched from one to another. That is, as described in supplementary notes in FIGS. 2 and 3, a rectangular wave-like waveform having an on-time (transmission state) of 5 ns is preset and stored at the pulse control circuit 86 as a transmittance waveform. The pulse control circuit 86 generates a control signal of the transmittance waveform which is repeated at a frequency of 100 MHz, which is the same as those of the first pulse waveform and the second pulse waveform. Then it outputs the generated control signals in the transmittance waveform set for four groups according to the on/off patterns of ultraviolet light (output light) to the EOM drivers 83a to 83d of each of the groups at the first timing or at the second timing on the basis of the predetermined time t0 as a reference. The first to fourth EOM drivers 83a to 83d output intensity modulator drive signals having signal levels which are suitable for driving the intensity modulators based on the control signals, each being of the transmittance waveform, which are outputted from the pulse control circuits 86, respectively, to drive the first to fourth intensity modulators 12a to 12d, respectively, therewith.

In this case, the mechanism, in which the pulse control circuit 86 outputs a control signal of the transmittance waveform to each of the EOM drivers according to the on/off pattern of ultraviolet light to cause either one of the first seed light Ls1 or the second seed light Ls2 to be outputted from the EOM driver, thereby outputting ultraviolet light in any desired on/off pattern, is the same as those according to the first construction form and the second construction form as already mentioned. On the other hand, in the laser device according to the present construction form, four branch optical paths are provided with intensity modulators 12a to 12d, respectively, and the control unit 8 is provided with EOM drivers 83a to 83d corresponding to the respective intensity modulators. As a result, the pulse control circuit 86 can cause ultraviolet light of different on/off patterns to be outputted from each of the groups by outputting control signals of transmittance waveforms of different patterns to each of EOM drivers, respectively.

For instance, if the output command for the first group I has an "off/on/on" pattern, the pulse control circuit 86 generates a control signal having a transmittance waveform of "second timing/first timing/first timing" and outputs the generated control signal to the first EOM driver 83a. That is, the phase of the time gate is changed so that the seed light to be extracted by the first intensity modulator 12a is to be "second seed light Ls2/first seed light Ls1/first seed light Ls1". In this case, in the first intensity modulator 12a, "second seed light Ls2/first seed light Ls1/first seed light Ls1" is extracted from the multiplexed seed light alternately containing the first seed light Ls1 and the second seed light Ls2 and the extracted light is inputted into the fiber amplifier 21 of the first group. In the fiber amplifier 21, the seed light of the above-mentioned pattern is amplified and the amplified light of a pattern of "second amplified light/first amplified light/first amplified light is inputted into the wavelength conversion optical system 30 of the first group".

Similarly, if the output command for the second group II is a pattern of "off/on/off", the pulse control circuit 86 generates a control signal of the transmittance waveform having a pattern of "second timing/first timing/second timing" and outputs the generated control signal to the second EOM driver 83b. In this case, in the second intensity modulator 12b, "second seed light Ls2/first seed light Ls1/second seed light Ls2" is extracted from the multiplexed seed light and the extracted light is inputted into the fiber amplifier 21 of the second group. In the fiber amplifier 21, the seed light of the above-mentioned pattern is amplified and the amplified light of a pattern of "second amplified light/first amplified light/second amplified light" is inputted into the wave length conversion optical system 30 of the second group.

The third group III for which the output command has a pattern of "off/off/on" and the fourth group IV for which the output command has a pattern of "on/on/off" are controlled in a similar manner as that described above. The EO intensity modulators that are advantageously used as the first to fourth intensity modulators 12a to 12d can change transmittance waveforms in a time of 0.1 ns or less. As a result, they can select any seed light on pulse-to-pulse basis from the string of multiplexed seed light containing the first seed light Ls1 and the second seed light Ls2 with an alternation period of 5 ns and output lights of various on/off patterns as mentioned above. This is also true for the laser device according to the first construction form and the laser device according to the second construction form.

Into the first group of the wavelength conversion unit 3 is inputted amplified light of a pattern of "second amplified light/first amplified light/first amplified light". The first amplified light and the second amplified light have the same pulse energy but have different pulse waveforms from each other. That is, the first amplified light is a high peak power pulse light that has a pulse duration of about 0.1 ns and relatively high peak power. The second amplified light is a low peak power pulse light that has a pulse duration of about 2 ns and a relatively low peak power. Assuming that both the pulse lights are set to have the same pulse energy, the peak power of the second amplified light is of about $1/20$ times the peak power of the first amplified light.

The conversion efficiency $\eta$ for generating third harmonic at the wavelength conversion optical element 32 is approximately proportional to a square of the peak power Pp of the amplified light. Consequently, the wavelength of the first amplified light, which has high peak power, is converted at a relatively high conversion efficiency to generate ultraviolet light Lv having a wavelength of 355 nm. On the other hand, for the second amplified light, which has relatively low peak power, the efficiency $\eta$ of wavelength conversion is about $1/400$ times the efficiency of wavelength conversion for the first amplified light so that substantially no ultraviolet light having a wavelength of 355 nm is generated. Therefore, ultraviolet light having a wavelength of 355 nm in the pattern of "off/on/on" is outputted from the wavelength conversion optical element 32 of the first group in the wavelength conversion unit 3.

The same is true for the wavelength conversion units 3 of the second group, the third group, and the fourth group. That is, ultraviolet light having a wavelength of 355 nm is outputted from the wavelength conversion optical element 32 of the second group in a pattern of "off/on/off", ultraviolet light having a wavelength of 355 nm is outputted from the wavelength conversion optical element 32 of the third group in a pattern of "off/off/on", and ultraviolet light having a wavelength of 355 nm is outputted from the wavelength conversion optical element 32 of the fourth group in a pattern of "on/on/off".

In the first example explained above, a construction is exemplified, in which use is made of a difference in height of peak power as means for forming the first seed light Ls1, the wavelength of which is converted at a relatively high efficiency at the wavelength conversion unit 3, and the second seed light Ls2, the wavelength of which is converted at a relatively low efficiency at the wavelength conversion unit 3, thereby enabling the output light, which is ultraviolet light, to be turned on/off. However, the first seed light Ls1 and the second seed light Ls2 may be formed by other means in the same manner as that already explained in the first construction form and the second construction form.

That is, as a second example, a construction is exemplified in which the wavelength λ1 of the first seed light Ls1 which is emitted by the first laser light source 11a and the wavelength λ2 of the second seed light Ls2 which is emitted by the second laser light source 11b are set to be different from each other and a difference in wavelength Δλ=|λ1−λ2| is used to turn on/off the ultraviolet light, which is the output light. As a third example, a construction is exemplified in which a polarization plane at which the first amplified light enters the wavelength conversion optical element 31 and a polarization plane at which the second amplified light enters the wavelength conversion optical elements 31 are set to take different angular positions from each other, and use is made of a difference in angle between the polarization planes to turn on/off the output light, which is ultraviolet light. As a fourth example, constructions in which the first to the third examples are combined as appropriate are exemplified. For instance, a difference ΔPp in height of peak power Pp is used and also, a difference Δλ in oscillation wavelength Δλ is used. This enables the extinction ratio of ultraviolet light to be increased greatly and effectively as compared with the respective examples separately.

In the laser device according to the present construction form explained above, the first laser light source 11a and the second laser light source 11b can be operated in a completely stationary state so that stable oscillation can be achieved. To each of the fiber amplifiers 21 of the first to fourth groups is always inputted either the first seed light Ls1 or the second seed light Ls2, both of which has the same pulse energy. This enables the inverted distribution state to be maintained constant and stable amplified light to be obtained.

Consequently, the laser device according to the present construction form, with a very simple construction to shift the gate-like transmittance waveform which is outputted from the pulse control circuit 86 in the direction of time axis according to the on/off pattern of the output command for each group, enables switching laser lights very stably and at high speed on pulse-to-pulse basis, and outputs ultraviolet light having any desired waveform, ranging from a pulse string having a relatively long on-time to a pulse string having a relatively short on-time. Moreover, with having a plurality of ultraviolet light outputs, as the laser light source includes one set of the first laser light source 11a and the second laser light source 11b, the device construction can be simplified. In addition, since a laser light source is used in common to generate input laser lights entering wavelength conversion optical elements in a plurality of groups, it is unnecessary to manage wavelength of respective laser light sources even when it is otherwise necessary to adjust the wavelength of the ultraviolet light which is outputted from the respective wave length conversion optical elements, so that the manufacture and operation of the device can be simplified.

In the laser device according to the present construction form, the first seed light which is outputted from the first laser light source 11a and the second seed light which is outputted from the second laser light source 11b are multiplexed and the resultant multiplexed seed light is divided into a plurality of seed lights and each of the divided seed lights is inputted into the corresponding fiber amplifier 21 of each group. This causes the power of the multiplexed seed light branched into each group to be decreased in inverse proportional to the number of divisions. Thus, in a case that a decrease in power level of the multiplexed seed light is at issue, for instance, in a case that the number of divisions is relatively large, the multiplexed seed light, at timing at which the first seed light and the second seed light are multiplexed, may be amplified to an appropriate power level by using, for instance, a fiber amplifier or an SOA (Semiconductor Optical Amplifier).

Fourth Construction Form

Figure 5:
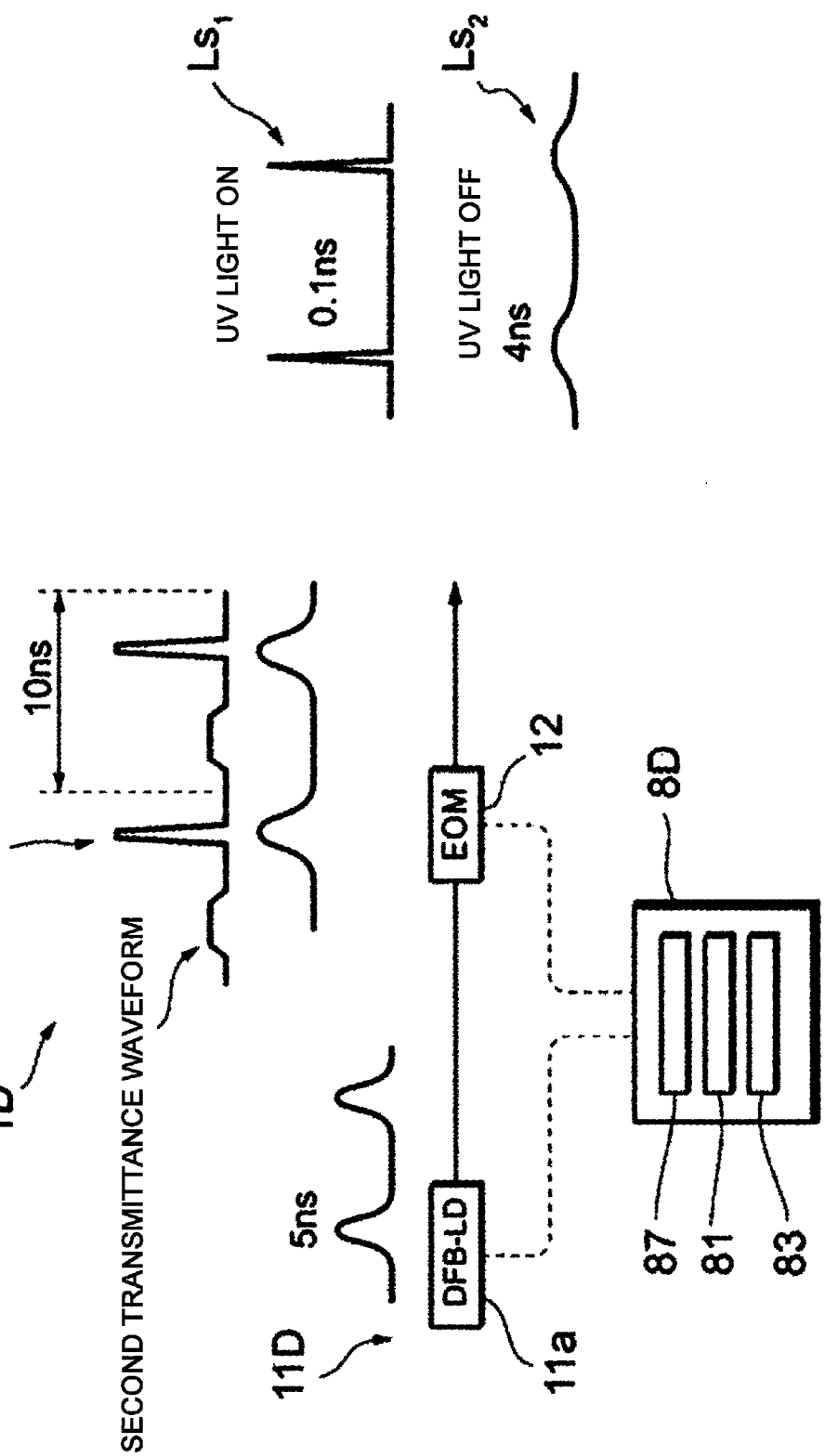
FIG. 5 is a diagram illustrating a schematic construction and operation of a laser light generation unit according to a fourth construction form of the present invention.

A diagram illustrating schematic construction and operation of a laser light generation unit 1D in a laser device according to a fourth construction form of the present invention is presented in FIG. 5. The laser light generation unit 1D includes a laser light source 11D and an intensity modulator 12. The laser light source 11D includes a single first laser light source 11a. The laser device according to the present construction form has the following features. That is, the laser light (base light) which is outputted from the laser light source 11D has a single pulse waveform and the transmittance waveforms which are extracted by the intensity modulator 12 are two high and low gate-like waveforms, i.e., a relatively high transmittance waveform and a relatively low transmittance waveform.

The first laser light source 11a generates a laser light having a base waveform (which is referred to as "base light") Lb at a predetermined frequency f based on a laser light source drive signal which is outputted from the control unit 8D. The base light which is generated at the first laser light source 11a, an example of which is a DFB semiconductor laser having an oscillation wavelength of 1064 nm, is inputted into the intensity modulator 12.

The intensity modulator 12 extracts either the first seed light Ls1 or the second seed light Ls2 from the single base light Lb based on the intensity modulator drive signal which is outputted from the control unit 8D and outputs the extracted light to the amplification unit 2. The waveform of the intensity modulator drive signal with which the intensity modulator 12 is driven, more specifically, the transmittance waveform of the intensity modulator 12 is a high and low gate-like waveform in which a first transmittance waveform having a relatively high transmittance for extracting first seed light (laser light in a first pulse waveform) Ls1 from the base light Lb and a second transmittance waveform having a relatively low transmittance for extracting second seed light (laser light in a second pulse waveform) Ls2 from the base light, which are alternately repeated at the predetermined frequency f. Mach-Zehnder EO intensity modulator can be advantageously used as the intensity modulator 12.

The control unit 8D includes a pulse control circuit 87, a first laser driver 81, and an EOM driver 83. The pulse control circuit 87 generates control signals for the first laser driver 81 and the EOM driver 83 on the basis of the reference clock of the control unit 8D taken as a reference and based on the preset base waveform and the transmittance waveform and outputs the generated control signals. The first laser driver 81 generates a laser light source drive signal having a signal level which is suitable for driving the first laser light source 11a based on the control signal of the base waveform which is outputted from the pulse control circuit 87 to drives the laser light source 11a therewith. The EOM driver 83 generates an intensity modulator drive signal having a signal level which is suitable for driving the intensity modulator based on the control signal having a transmittance waveform which is outputted from the pulse control circuit 87 to drive the intensity modulator 12 therewith.

The laser device having such a construction form is explained hereafter by way of examples with concrete numerical values. The pulse control circuit 87 presets and stores the base waveform for generating the base light, and the transmittance waveforms for extracting first seed light and second seed light from the base light.

The base waveform is a waveform with which the base light from which the first seed light Ls1 and the second seed light Ls2 are extracted. For instance, as described in a supplementary note in FIG. 5, a pulse waveform having an on-time at about 5 ns is preset and stored as the base waveform at the pulse control circuit 87. The pulse control circuit 87 generates a control signal having a base waveform which is repeated at a frequency of 100 MHz on the basis of the reference clock counted from the predetermined time t0 taken as a reference. Then, it outputs the generated control signal having a base waveform to the first laser driver 81 at the predetermined timing counted from the predetermined time t0 as a reference.

The first laser driver 81 converts the control signal into a control signal having a signal level which is suitable for driving the first laser light source 11a to output a laser light source drive signal and drives the first laser light source 11a therewith. As a result, the laser light having a base waveform, that is, the base light Lb is constantly outputted from the first laser light source 11a at a repetition period of 10 ns (frequency of 100 MHz). The base light Lb which is outputted from the first laser light source 11a is inputted into the intensity modulator 12 without further processing.

The transmittance waveform includes a first transmittance waveform having a relatively short time duration and a relatively high transmittance and a second transmittance waveform having a relatively long time duration and a relatively low transmittance. For instance, the first transmittance waveform is set to have a time duration of 0.1 ns and a transmittance of 100% (the maximum transmittance of the intensity modulator 12). The second transmittance waveform is set to have a time duration of 4 ns and a transmittance of 2.5%. These transmittances are set so that the first seed light Ls1 and the second seed light Ls2, which are extracted by the intensity modulator 12, have the same pulse energy. The pulse control circuit 87 generates control signals in the transmittance waveform based on the first transmittance waveform and second transmittance waveform which are preset and stored. The control signal of the transmittance waveform is a high and low gate-like waveform in which the first transmittance waveform and the second transmittance waveform are alternately repeated at a frequency of 100 MHz.

That is, the control signal of the transmittance waveform has a waveform which is obtained by combining a first transmittance waveform having a transmittance of 100%, which is repeated at a frequency of 100 MHz (repetition period of 10 ns), with a second transmittance waveform having a transmittance of 2.5%, which is repeated at the same frequency of 100 MHz (repetition period of 10 ns) but repeated at different timing. In the exemplified example, the first transmittance waveform and the second transmittance waveform are shifted by 5 ns, which is half the repetition period, from each other. In other words, the control signal of the transmittance waveform is a high and low gate-like signal obtained by combining a first transmittance waveform having a time duration of 0.1 ns and a transmittance of 100% with a second transmittance waveform having a time duration of 4 ns and a transmittance of 2.5%, which transmittance waveforms are each alternately repeated being shifted in units of 5 ns one from another.

The pulse control circuit 87 outputs the control signal of the transmittance waveform to the EOM driver 83 at timing in accordance with the on/off pattern of the ultraviolet light (output light), taking timing at which the base waveform and the first transmittance waveform correspond to each other as a first timing and timing at which the base waveform and the second transmittance waveform correspond to each other as a second timing counted from the predetermined time t0 of the reference clock taken as a reference. The EOM driver 83 generates an intensity modulator drive signal having a signal level which is suitable for driving the intensity modulator based on the control signal having a transmittance waveform which is outputted from the pulse control circuit 87 to drive the intensity modulator 12 therewith.

For instance, in a case that the output command for ultraviolet light is in an on state, the pulse control circuit 87 outputs a control signal of the transmittance waveform at the first timing to the EOM driver 83 to operate the intensity modulator 12. In this case, the control signal which is outputted to the EOM driver 83 is a signal which, at timing corresponding to the timing at which the base light Lb enters the intensity modulator 12, causes the intensity modulator 12 to operate at a time duration of 0.1 ns and a transmittance of 100%.

When the output command for ultraviolet light is in an off state, the pulse control circuit 87 outputs a control signal of the transmittance waveform to the EOM driver 83 at the second timing to operate the intensity modulator 12. In this case, the control signal which is outputted to the EOM driver 83 is a signal which, at timing corresponding to the timing at which the base light Lb enters the intensity modulator 12, causes the intensity modulator 12 to output light having a time duration of 4 ns and a transmittance of 2.5%.

For this purpose, while the output command is in the on state, the first seed light Ls1 having a time duration of 0.1 ns and a peak intensity of 1 (arbitrary unit) is outputted from the intensity modulator 12 and while the output command is in the off state, the second seed light Ls2 having a time duration of 4 ns and a peak intensity of 0.025 (arbitrary unit) is outputted from the intensity modulator 12.

The pulse string of the first seed light Ls1 which is outputted from the intensity modulator 12 while the output command is in the on state and the pulse string of the second seed light Ls2 which is outputted from the intensity modulator 12 while the output command is in the off state enter the amplification unit 2 and are amplified through the fiber amplifier 21. The first seed light Ls1 and the second seed light Ls2 are set to have different pulse waveforms from each other but have the same pulse energy. To the fiber amplifier 21 is constantly inputted either the pulse string of the first seed light Ls1 or the pulse string of the second seed light Ls2 at a frequency of 100 MHz according to the output command. This enables the inverted distribution state of Yb atoms at the fiber amplifier 21 to be always maintained constant regardless of whether the output command is in the on state or in the off state, or regardless of how the time duration of the on state and the time duration of the off state are allocated.

Into the wavelength conversion unit 3 is input first amplified light, which is amplified light of the first seed light Ls1, while the output command is in the on state, and also second amplified light, which is amplified light of the second seed light Ls2, while the output command is in the off state. The first amplified light and the second amplified light have the same pulse energy but have different pulse waveforms from each other. That is, the first amplified light is a high peak power pulse light that has a pulse duration of about 0.1 ns and relatively high peak power of 1 (arbitrary unit). The second amplified light is a low peak power pulse light that has a pulse duration of about 4 ns and relatively low peak power of 0.025 (arbitrary unit). If both the pulse lights are set to have the same pulse energy, the peak power of the second amplified light is about 1/40 times the peak power of the first amplified light.

The efficiency η of wavelength conversion for generating a third harmonic at the wavelength conversion optical element 32 is approximately proportional to a square of the peak power Pp of the amplified light. Consequently, the wavelength of the first amplified light, which has high peak power, is converted at a high conversion efficiency to generate ultraviolet light having a wavelength of 355 nm. On the other hand, for the second amplified light, which has relatively low peak power, the efficiency η of wavelength conversion is 1/1000 or less times the efficiency of wavelength conversion for the first amplified light and substantially no ultraviolet light having a wavelength of 355 nm is generated.

The laser device according to the present construction form explained above, in which the first laser light source 11a operates in a completely stationary state, can oscillate stably. To the fiber amplifier 21 is always inputted either the first seed light Ls1 or the second seed light Ls2, both of which has the same pulse energy. This enables the inverted distribution state to be maintained constant and stable amplified light to be obtained.

Consequently, the laser device according to the present construction form is capable of outputting ultraviolet light having any desired waveform, ranging from a pulse string having a relatively long on-time to a pulse string having a relatively short on-time to be switched from one to another very stably and at high speed in units of pulse, by a simple construction to shift the high and low gate-like transmittance waveform in the direction of time axis according to the on/off pattern of the output command. The laser device according to the present construction form, in which a portion of the base light which is outputted from the first laser light source 11a is extracted by the intensity modulator 12 to generate the first seed light Ls1 and the second seed light Ls2, enables the generated ultraviolet light to have a bandwidth narrower than that achieved by the construction that directly modulates the intensity of the laser light source to generate the first seed light and the second seed light.

Fifth Construction Form

Figure 6:
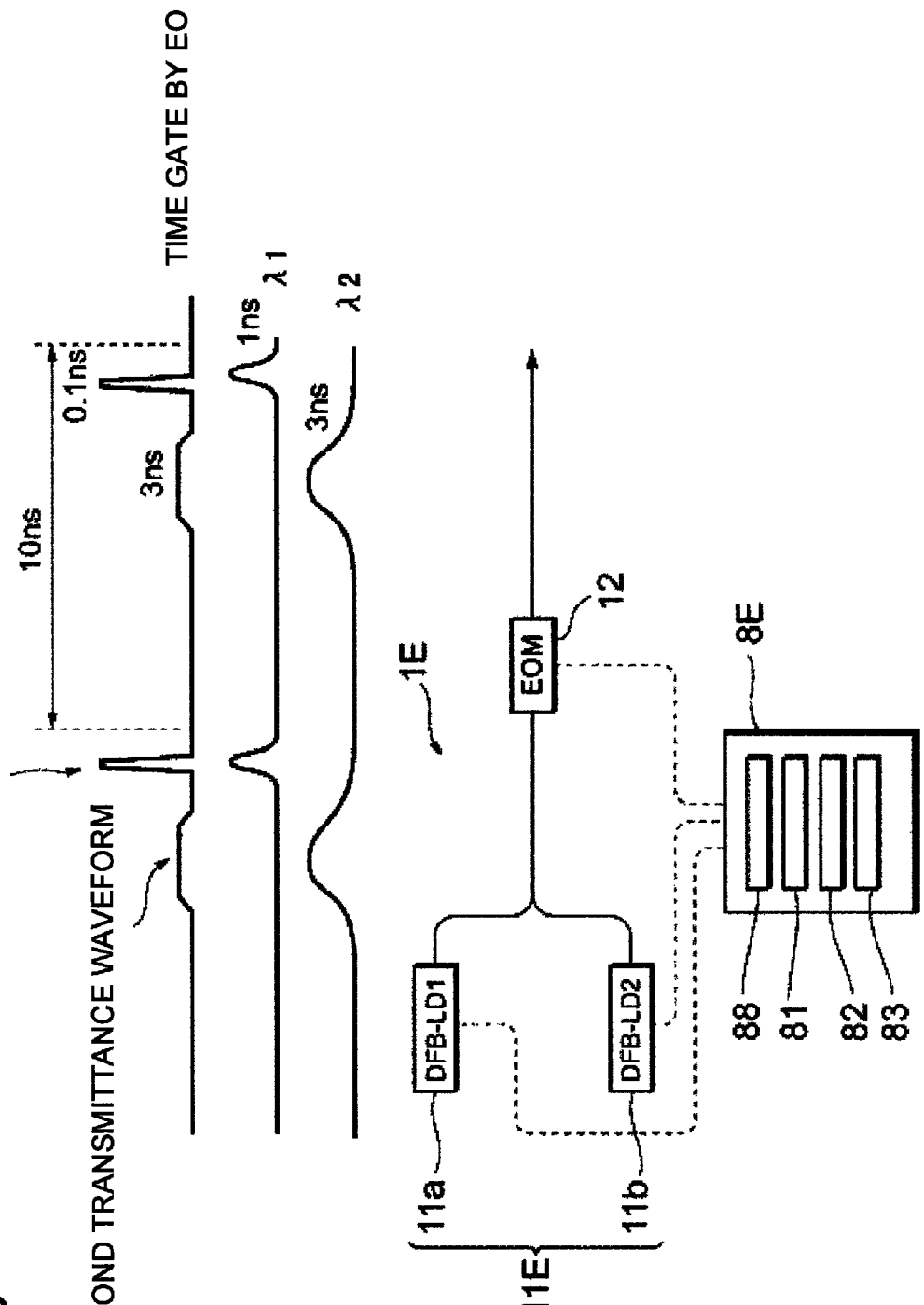
FIG. 6 is a diagram illustrating a schematic construction and operation of a laser light generation unit in a laser device according to a fifth construction form of the present invention.

A diagram illustrating schematic construction and operation of a laser light generation unit 1E in a laser device according to a fifth construction form of the present invention is presented in FIG. 6. The laser light generation unit 1E includes a laser light source 11E and an intensity modulator 12. The laser light source 11E includes a first laser light source 11a and a second laser light source 11b. The laser device according to the present construction form has the following features. That is, the laser light which is outputted from the laser light source 11E (base light) includes two components, i.e., a first base light for being extracted the first seed light and second base light for being extracted the second seed light. The transmittance waveforms which are extracted by the intensity modulator 12 include two high and low gate-like waveforms, i.e., a relatively high transmittance waveform and a relatively low transmittance waveform.

The first laser light source 11a is a light source that generates a laser light of a first base waveform (referred to as "first base light") Lb1 at the predetermined frequency f based on a first laser light source drive signal which is outputted from the control unit 8E. The second laser light source 11b is a light source that generates a laser light of a second base waveform (referred to as "second base light") Lb2 at the same frequency f as that of the first laser light source 11a at timing different from that of the first laser light source 11a based on a second laser light source drive signal which is outputted from control unit 8E. An example of the first laser light source 11a is a DFB semiconductor laser having an oscillation wavelength of λ1 and an example of the second laser light source 11b is a DFB semiconductor laser having an oscillation wavelength of λ2. In a first example, the wavelengths are set to λ1=λ2=1064 nm.

The first base light Lb1 which is generated at the first laser light source 11a and the second base light Ls2 which is generated at the second laser light source 11b are multiplexed through a coupler or the like and the multiplexed base light formed by multiplexing the first base light Lb1 and the second base light Lb2 (referred to as "multiplexed base light") enters the intensity modulator 12.

The intensity modulator 12 extracts either the first seed light Ls1 or the second seed light Ls2 from the multiplexed base light consisting of the first base light Lb1 and the second base light Lb2 based on an intensity modulator drive signal which is outputted from the control unit 8E and outputs the extracted light to the amplification unit 2. The waveform of the intensity modulator drive signal with which the intensity modulator 12 is driven, more specifically, the transmittance waveform of the intensity modulator 12 is a high and low gate-like waveform in which a first transmittance waveform for extracting the first seed light (a laser light in a first pulse waveform) Ls1 from the first base light Lb1 and a second transmittance waveform for extracting the second seed light (a laser light in a second pulse waveform) Ls2 from the second base light Lb2, each being alternately repeated at the predetermined frequency f. A Mach-Zehnder EO intensity modulator can be advantageously used as the intensity modulator 12.

The control unit 8E includes a pulse control circuit 88, a first laser driver 81, a second laser driver 82, and an EOM driver 83. The pulse control circuit 88, on the basis of a reference clock of the control unit 8E, generates a control signal for each of the first laser driver 81 and the EOM driver 83 based on the preset first base waveform, the second base waveform, and the transmittance waveform and outputs the resultant signals.

The first laser driver 81 generates a first laser light source drive signal having a signal level which is suitable for driving the first laser light source based on a control signal of the first base waveform which is outputted from the pulse control circuit 88 to drive the first laser light source 11*a* therewith. Similarly, the second laser driver 82 generates a second laser light source drive signal having a level which is suitable for driving the second laser light source based on a control signal of the second base waveform which is outputted from the pulse control circuit 88 to drive the second laser light source 11*b* therewith. The EOM driver 83 generates an intensity modulator drive signal having a level which is suitable for driving the intensity modulator based on a control signal of the transmittance waveform which is outputted from the pulse control circuit 88 to drive the intensity modulator 12 therewith.

The laser device having such a construction form is explained hereafter by way of examples with concrete numerical values. The pulse control circuit 88 presets and stores a first base waveform for generating a first base light Lb1, a second base waveform for generating a second base light Lb2, and a transmittance waveform for extracting first seed light and second seed light from the synthetic base light as waveforms.

The first base waveform is a waveform for generating the first base light Lb1 which is used for extracting the first seed light Ls1. For instance, as described in a supplementary note in FIG. 6, a pulse waveform having an on-time of about 1 ns is preset and stored as the first base waveform at the pulse control circuit 88. The pulse control circuit 88 generates a control signal having the first base waveform which is repeated at a frequency of 100 MHz. Then, it outputs the generated control signal having the first base waveform to the first laser driver 81 at prescribed first timing counted from the predetermined time t0 taken as a reference. The first laser driver 81 converts this control signal into a control signal having a signal level which is suitable for driving the first laser light source to output a first laser light source drive signal to drive the first laser light source 11*a* therewith. As a result, the first base light Lb1 having a relatively high peak power and relatively long pulse duration is constantly outputted from the first laser light source 11*a* at a repetition period of 10 ns (frequency of 100 MHz).

The second base waveform is a waveform for generating the second base light Lb2 which is used for extracting the second seed light Ls2. For instance, as shown in the drawing, a pulse waveform having an on-time of about 3 ns is preset and stored as the second base waveform at the pulse control circuit 88. The pulse control circuit 88 generates a control signal having the second base waveform which is repeated at a frequency of 100 MHz. Then, it outputs the generated control signal having the second base waveform to the second laser driver 82 at a second timing which is counted from the predetermined time t0 taken as a reference. In this case, the timing at which the control signal of the first base waveform is outputted and the timing at which the control signal of the second base waveform is outputted are set different from each other. This is contemplated to separate the first seed light Ls1 and the second seed light Ls2 after multiplexing them so that they will not overlap timewise at the intensity modulator 12.

In the present embodiment, the control signal of the second base waveform is set to be delayed by 6.5 ns from the control signal of the first base waveform. The second laser driver 82 converts the control signal thus set into a control signal having a signal level which is suitable for driving the second laser light source to output a second laser light source drive signal and drives the second laser light source 11*b* therewith. As a result, the second base light Lb2 having the same repetition period of 10 ns (frequency of 100 MHz) as that of the first base light Lb1 but having a longer pulse duration than the first base light Lb1 is constantly outputted with the timing at which light is emitted being delayed by 6.5 ns from that of the first base light Lb1.

The first base light Lb1 which is outputted from the first laser light source 11*a* and the second base light Lb2 which is outputted from the second laser light source 11*b* are multiplexed through a coupler or the like and the resultant multiplexed base light which is formed by multiplexing the first base light Lb1 and the second base light Lb2 enters the intensity modulator 12. In this case, the pulse string of the first base light Lb1 and the pulse string of the second base light Lb2 have the same repetition period of 10 ns, with the phase of the second base light Lb2 being delayed by 6.5 ns with respect to the phase of first base light Lb1.

The transmittance waveform includes a first transmittance waveform having a relatively short time duration and a relatively high transmittance and a second transmittance wave form having a relatively long time duration and a relatively low transmittance. For instance, the first transmittance waveform is set to have a time duration of 0.1 ns and a transmittance of 100% (the maximum transmittance of the intensity modulator 12) and the second transmittance waveform is set to have a time duration of 3 ns and a transmittance of 3.3%. These transmittances are set so that the first base light Lb1 and the second base light Lb2, which are extracted by the intensity modulator 12, have the same pulse energy. The transmittance of the second transmittance waveform may be set to 100% by adjusting the output level of the second laser light source 11*b*.

The pulse control circuit 88 generates a control signal of the transmittance waveform based on the first transmittance waveform and the second transmittance waveform which are set and stored. The control signal of the transmittance waveform is a high and low gate-like waveform that includes the first transmittance waveform and the second transmittance waveform, each of which is alternately repeated at a frequency of 100 MHz. That is, the control signal of the transmittance waveform has is a combined waveform obtained by combining a first transmittance waveform having a transmittance of 100% which is repeated at a frequency of 100 MHz (repetition period of 10 ns) with a second transmittance waveform having a transmittance of 3.3% which is repeated at the same frequency of 100 MHz (repetition period 10 ns) but at timing different from that of the first transmittance waveform. In an example, the second transmittance waveform is delayed by 6.5 ns from the first transmittance waveform. In other words, the control signal of the transmittance waveform is a high and low gate-like signal which is obtained by combining a first transmittance waveform having a time duration of 0.1 ns and a transmittance of 100% with a second transmittance waveform having a time duration of 3 ns and a transmittance of 3.3%, which transmittance waveforms are each alternately repeated.

The pulse control circuit 88 generates a control signal of the transmittance waveform which is repeated at the same frequency of 100 MHz as those of the first base waveform and the second base waveform. Then, it outputs the generated control signal of the transmittance waveform to the EOM driver 83 according to the on/off pattern of the ultraviolet light (output light) either at first timing or at second timing which is counted from the predetermined time t0 taken as a reference. The EOM driver 83 generates an intensity modulator drive signal having a signal level which is suitable for driving the intensity modulator based on the control signal having a transmittance waveform which is outputted from the pulse control circuit 88 to drive the intensity modulator 12 therewith.

For instance, in a case that the output command for ultraviolet light is in an on state, the pulse control circuit 88 outputs a control signal of the transmittance waveform to the EOM driver 83 at the first timing to operate the intensity modulator 12. In this case, the control signal which is outputted to the EOM driver 83 is a signal which, at timing corresponding to the timing at which the first base light Lb1 is inputted to the intensity modulator 12, drives the intensity modulator 12 to output light having a time duration of 0.1 ns and a transmittance of 100%.

In a case that the output command for ultraviolet light is in an off state, the pulse control circuit 88 outputs a control signal of the transmittance waveform to the EOM driver 83 at second timing to operate the intensity modulator 12. In this case, the control signal which is outputted to the EOM driver 83 is a signal which, at timing corresponding to the timing at which the second base light Lb2 is inputted to the intensity modulator 12, drives the intensity modulator 12 to output light having a time duration of 3 ns and a transmittance of 3.3%.

As a result, while the output command is in the on state, the first seed light Ls1 having a time duration of 0.1 ns and a high peak intensity is outputted from the intensity modulator 12 and while the output command is in the off state, the second seed light Ls2 having a time duration of 3 ns and a low peak intensity is outputted from the intensity modulator 12.

The pulse string of the first seed light Ls1 which is outputted from the intensity modulator 12, while the output command is in the on state, and the pulse string of the second seed light Ls2 which is outputted from the intensity modulator 12, while the output command is in the off state, enter the amplification unit 2 and are amplified through the fiber amplifier 21. The first seed light Ls1 and the second seed light Ls2 are set to have different pulse waveforms from each other but the same pulse energy. To the fiber amplifier 21 is constantly inputted either the pulse string of the first seed light Ls1 or the pulse string of the second seed light Ls2 according to the output command at a frequency of 100 MHz. This enables the inverted distribution state of Yb atoms at the fiber amplifier 21 to be always maintained constant regardless of whether the output command is in the on state or in the off state, or regardless of how the time duration of the on state and the time duration of the off state are allocated.

Into the wavelength conversion unit 3 is inputted a first amplified light, which is an amplified light of the first seed light Ls1, while the output command is in the on state, and also a second amplified light, which is an amplified light of the second seed light Ls2, while the output command is in the off state. The first amplified light and the second amplified light have the same pulse energy but different pulse waveforms from each other. That is, the first amplified light is a pulse light that has a pulse duration of about 0.1 ns and relatively high peak power of 1 (arbitrary unit). The second amplified light is a pulse light that has a pulse duration of about 3 ns and relatively low peak power of 0.033 (arbitrary unit). If both the pulse lights are set to have the same pulse energy, the peak power of the second amplified light is about 1/30 times the peak power of the first amplified light.

The efficiency $\eta$ of wavelength conversion for generating a third harmonic at the wavelength conversion optical element 32 is approximately proportional to a square of the peak power Pp of the amplified light. Consequently, the wavelength of the first amplified light, which has relatively high peak power, is converted at high conversion efficiency to generate ultraviolet light having a wavelength of 355 nm. On the other hand, for the second amplified light, which has relatively low peak power, the efficiency $\eta$ of wavelength conversion is about 1/1000 times the efficiency of wavelength conversion for the first amplified light and substantially no ultraviolet light having a wavelength of 355 nm is generated.

In the first example explained above, a construction is exemplified, in which use is made of a difference in height of peak power as means for forming the first seed light Ls1, the wavelength of which is converted at a relatively high efficiency at the wavelength is conversion unit 3, and the second seed light Ls2, the wavelength of which is converted at a relatively low efficiency at the wavelength conversion unit 3, thereby enabling ultraviolet light, which is an output light, to be turned on/off. However, as already mentioned, the first seed light Ls1 and the second seed light Ls2 may be formed by other means in the same manner as those explained in the first to the third construction form (refer to the second to the fourth examples in each construction form).

The laser device according to the present construction form explained above, in which the first laser light source 11*a* and the second laser light source 11*b* are respectively operated in a completely stationary state, can oscillate stably. To the fiber amplifier 21 is always inputted either the first seed light Ls1 or the second seed light Ls2, both of which has the same pulse energy. This enables the inverted distribution state to be maintained constant and stable amplified light to be obtained.

Consequently, the laser device according to the present construction four is capable of outputting ultraviolet light having any desired waveform, ranging from a pulse string having a relatively long on-time to a pulse string having a relatively short on-time to be switched from one to another very stably and at high speed in units of pulse, by a simple construction to shift the high and low gate-like transmittance waveform in the direction of time axis according to the on/off pattern of the output command. The laser device according to the present construction form, in which a portion of the first base light which is outputted from the first laser light source 11*a* is extracted by the intensity modulator 12 to generate the first seed light Ls1 and the second base light which is outputted from the second laser light source 11*b* is extracted by the intensity modulator 12 to generate the second seed light Ls2, enables the generated ultraviolet light having a bandwidth narrower than that achieved by the construction that directly modulates the intensity of the laser light source to generate the first seed light and the second seed light.

In the embodiment explained above, explanation is made of a configuration, in which the seed lights having wavelengths in a 1.06 μm band are outputted from the laser light generation unit 1 and ultraviolet light having a wavelength of 355 nm is outputted by converting seed lights by the two wavelength conversion optical element 31, 32 in the wavelength conversion unit 3. However, the wavelength band of the seed light, the number and arrangement of the wavelength conversion optical elements, and the wavelength of the output light and so on may be selected in any desired manner, so that the present invention may be adopted in various known constructions.

The laser device LS explained above is small in size and light in weight and is easy to handle, so that it can be advantageously adopted in various systems, for instance, optical processing devices such as an exposure device, an optical modeling device and the like, inspection devices for inspecting photomasks, wafers and the like, observation devices such as a microscope, a telescope and the like, measuring devices such as an length measuring machine, a shape measuring machine and the like, optical treatment devices, and the like.

Figure 7:
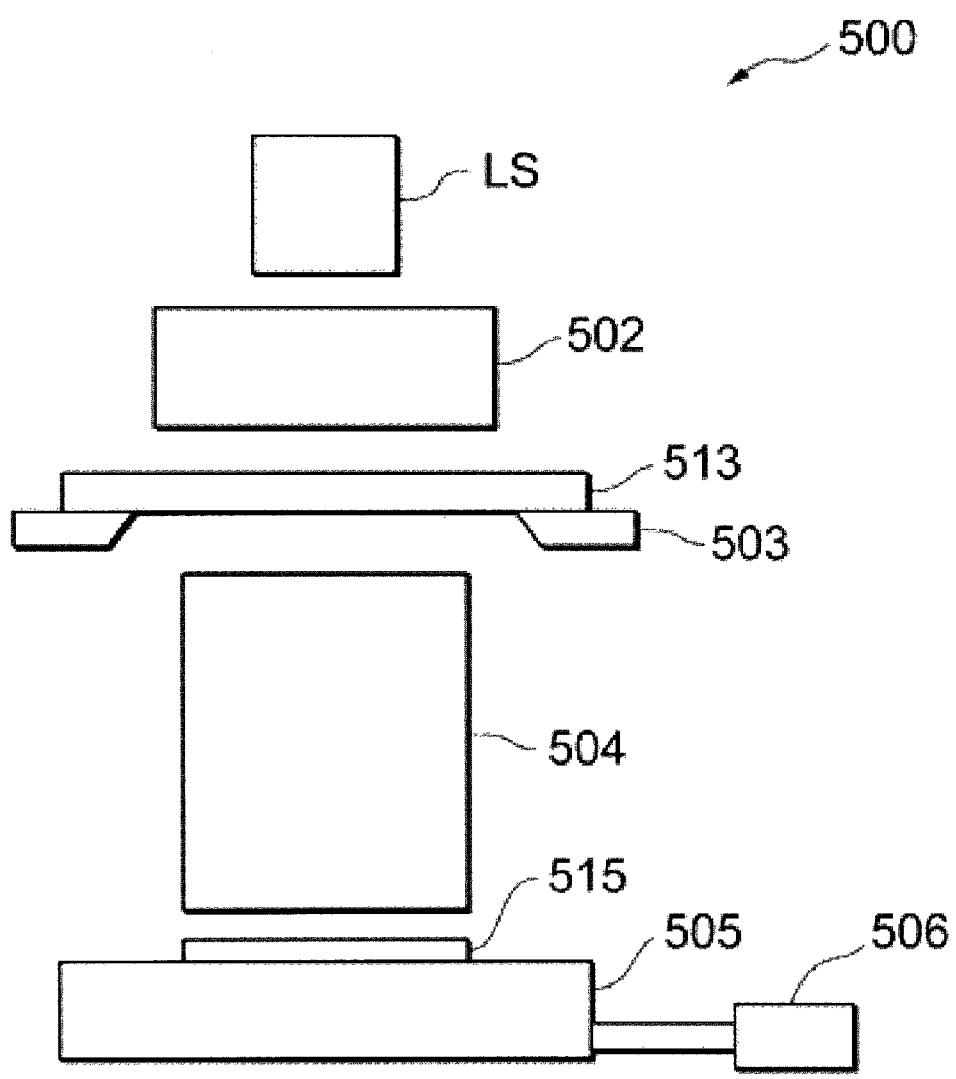
FIG. 7 is a schematic construction diagram showing an exposure device according to a first construction form of the present invention presented as a first application example of a system provided with a laser device.

Explanation is made of an exposure device for use in a photolithography process for manufacturing semiconductors and liquid crystal panels as a first application example of a system including a laser device LS with reference to FIG. 7 showing its schematic structure. In an exposure device 500, it is used a principle that is the same as that of photoengraving process. That is, a device pattern precisely depicted on a photomask 513 made of fused silica is transferred by optically projecting it onto an exposure target 515, such as a semiconductor wafer or a glass substrate which is coated with a photoresist.

The exposure device 500 includes the laser device LS mentioned above, an illumination optical system 502, a mask support stage 503 that holds a photomask 513, a projection optical system 504, an exposure target support table 505 that holds the exposure target 515, and a drive mechanism 506 that moves the exposure target support table 505 in a horizontal plane. The illumination optical system 502 includes a plurality of lenses and illuminates the photomask 513 held on the mask support stage 503 with the laser light which is outputted from the laser device LS. The projection optical system 504 also includes a plurality of lenses and projects the light that has transmitted the photomask 513 onto the exposure target 515 on the exposure target support table.

In the exposure device 500 having the above-mentioned construction, the laser light which is outputted from the laser device LS is inputted into the illumination optical system 502 and the laser light which is adjusted to a predetermined light flux is irradiated onto the photomask 513 that is held on the mask support stage 503. The light that has passed through the photomask 513 has an image of the device pattern depicted on the photomask 513 and this light is irradiated at a predetermined position on the exposure target 515 that is held by the exposure target support table 505 via the projection optical system 504. This causes the image of the device pattern of the photomask 513 to be formed on the exposure target 515 at a predetermined magnification.

Figure 8:
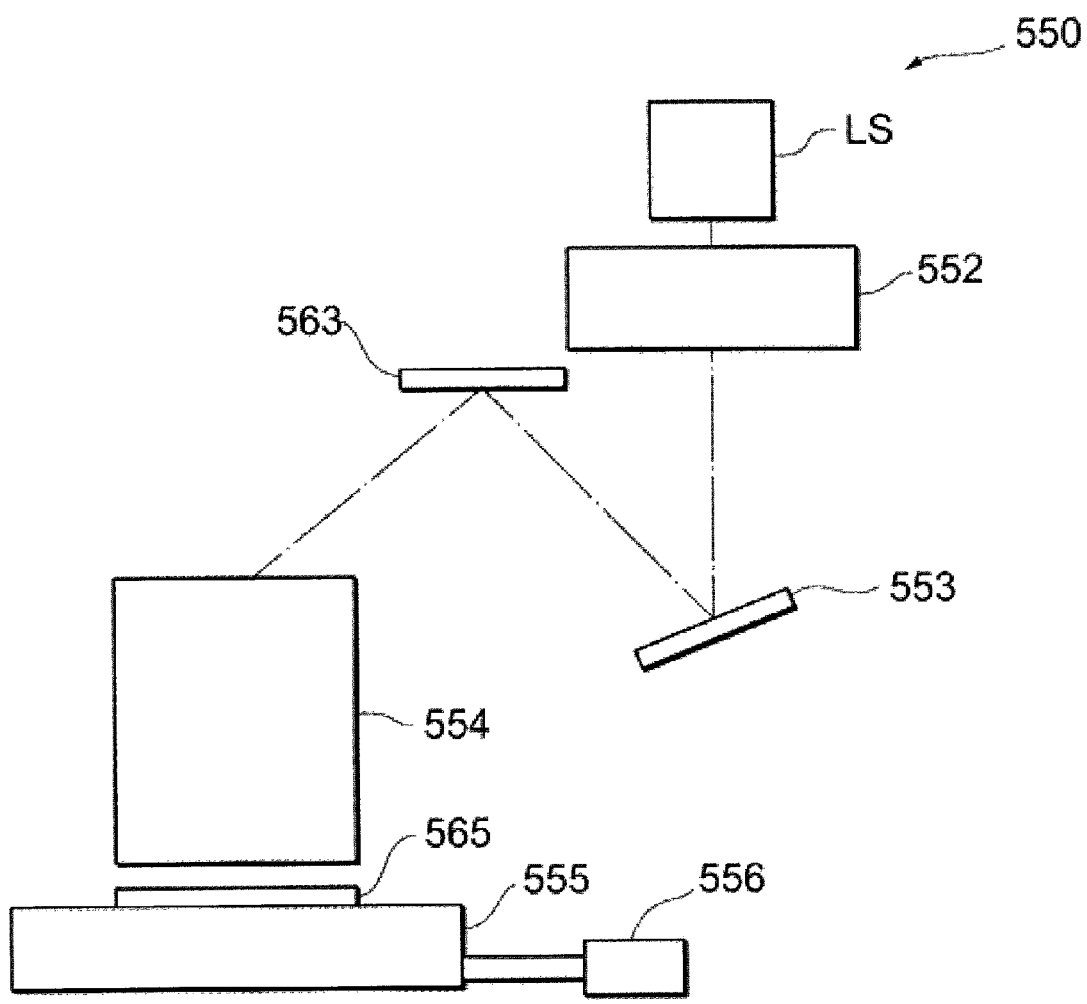
FIG. 8 is a schematic construction diagram showing an exposure device according to a second construction form of the present invention presented as a second application example of a system provided with a laser device.

As a second application example of the system provided with the laser device LS, explanation is made of an exposure device with a variable forming mask with reference to FIG. 8 showing a schematic construction of it. The exposure device 550 is basically the same as the exposure device 500 according to the first construction form except that the exposure device 550 is provided with a variable forming mask instead of the photomask and optically projects an image of any desired pattern which is generated by the variable forming mask onto the exposure target 565, such as a glass substrate or a semiconductor wafer which is coated with a photoresist, to transfer the image (for instance, refer to JP 5211487 C, JP 2012-54500 A, JP 2011-49296 A, etc.).

The exposure device 550 includes the laser device LS described above, an illumination optical system 552, a variable forming mask 563, a projection optical system 554, an exposure target support table 555 that holds an exposure target 565, and a drive mechanism 556 that moves the exposure target support table 555 in a horizontal plane. The illumination optical system 552 includes a plurality of lenses and illuminates the variable forming mask 563 with the laser light which is outputted from the laser device LS via a mirror 553. The projection optical system 554 also includes a plurality of lenses and projects the generated light of any desired pattern onto the exposure target 565 which is held on the exposure target table 555 via the variable forming mask 563.

Figure 9:
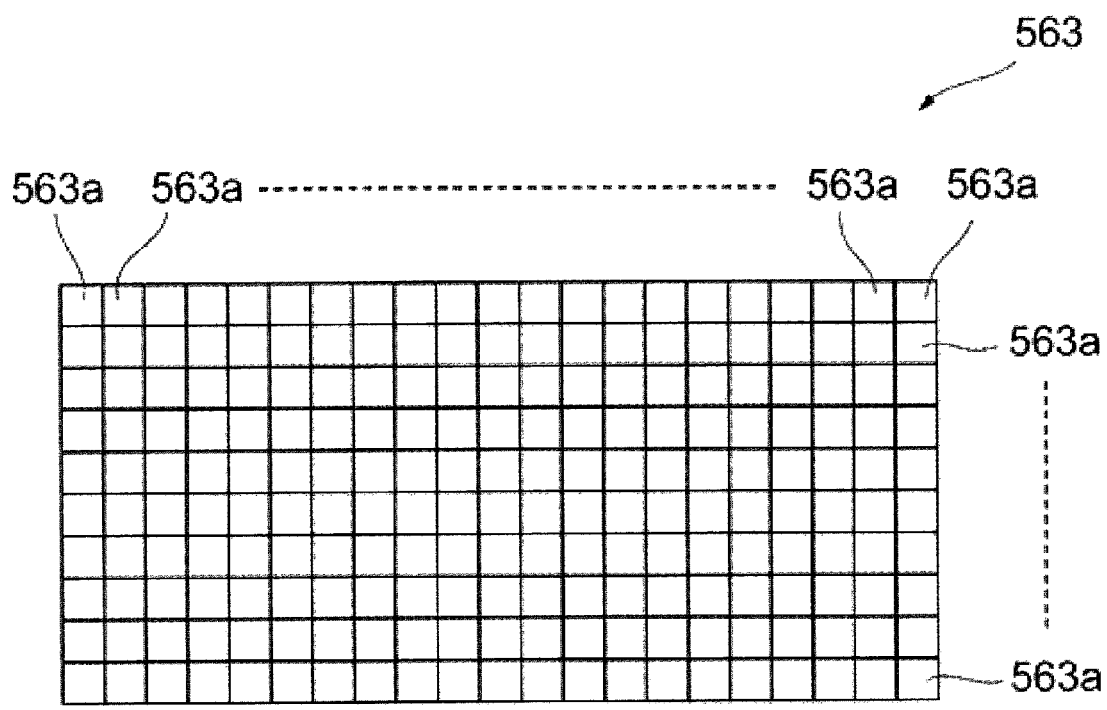
FIG. 9 is a schematic diagram showing a DMD (Digital Micromirror Device or Deformable Micromirror Device) taken as an example of a variable forming mask.
Figure 10:
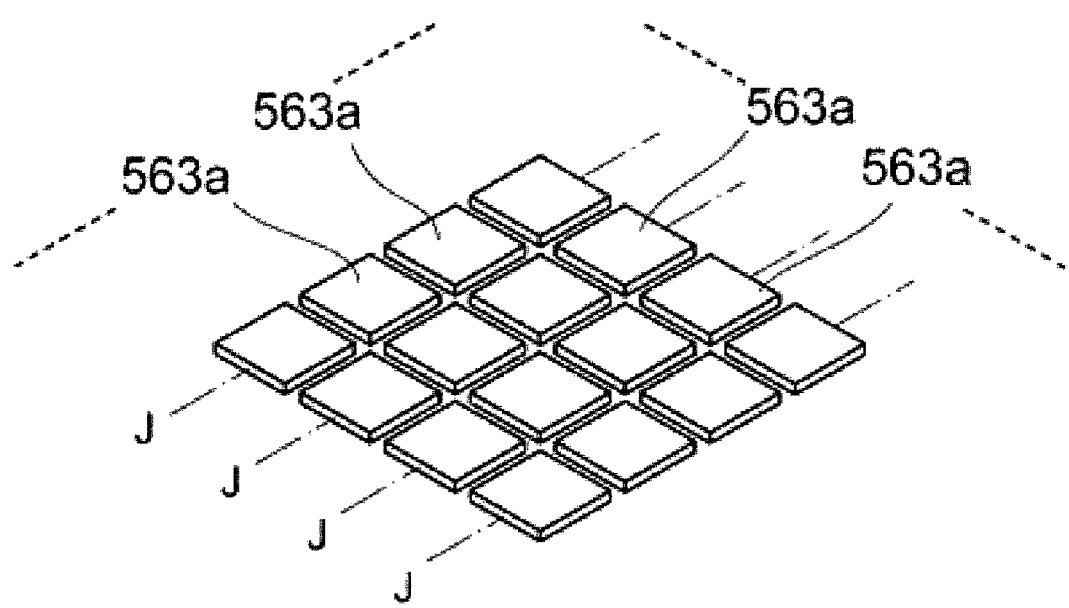
FIG. 10 is an enlarged perspective view of a portion of the DMD described above.
Figure 1:
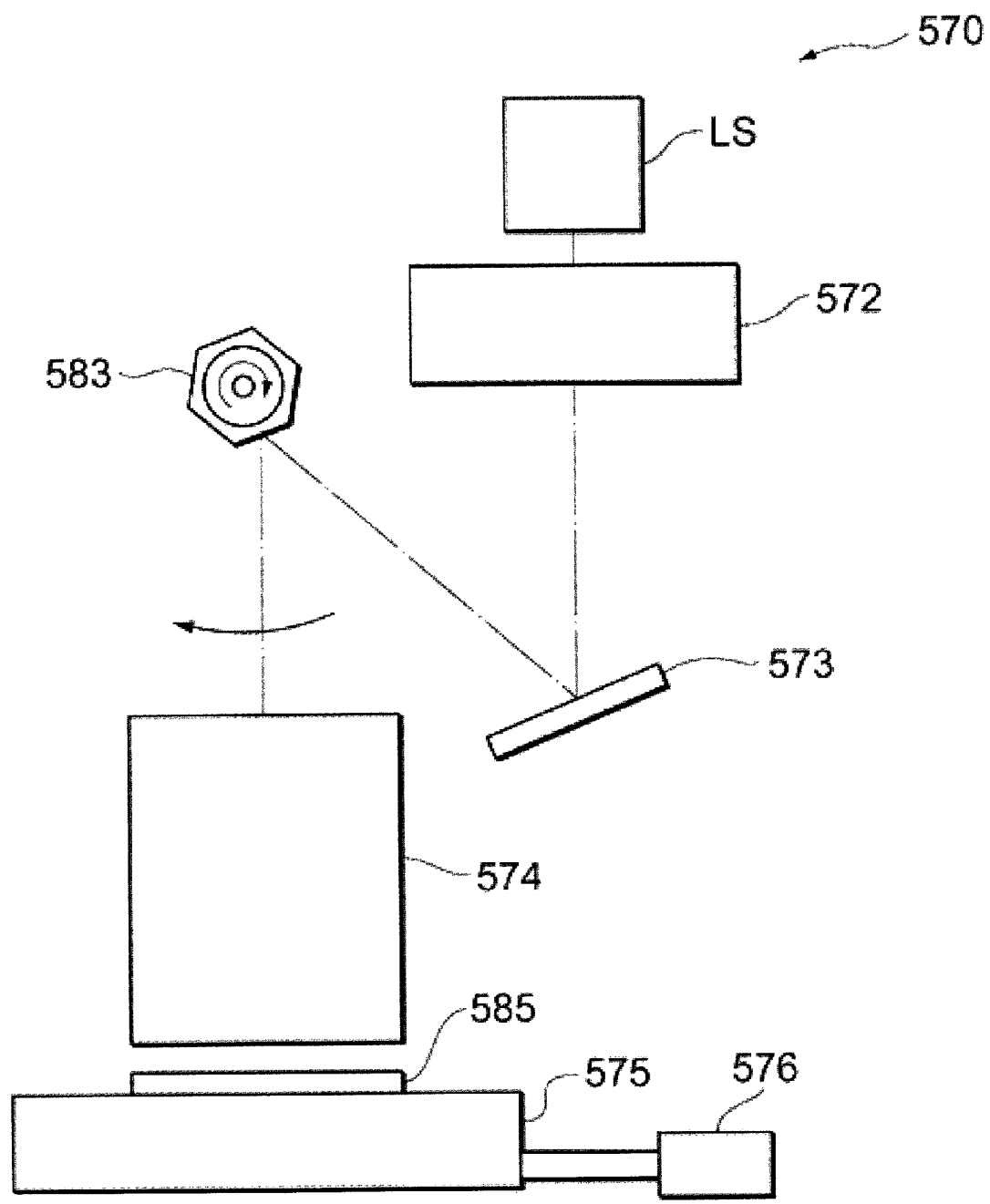

The variable forming mask 563 is configured to include a plurality of movable mirrors and is capable of generating reflection light in any desired pattern. For instance as shown in FIG. 9, a DMD (Digital Micromirror Device or Deformable Micromirror Device) in which the movable mirrors 563*a* are dimensionally arranged over m arrows×n columns is advantageously used. As shown in FIG. 10 presenting a portion of a DMD in an enlarged perspective view, each of the movable mirrors 563*a*, 563*a*, . . . are provided in rotatable independently about an axis J which extends in a direction perpendicular to an incidence or output plane, thereby enabling each movable mirror to be switched between an on-position and an off-position by a DMD drive device (not shown).

If the movable mirror 563*a* is set at the on-position, the light which is outputted from the illumination optical system 552 and reflected by the movable mirror 563*a* enters the projection optical system 554 to form an image on the exposure plane of the exposure target 565. On the other hand, if the movable mirror 563*a* is set at the off-position, the light which is outputted from the illumination optical system 552 and reflected by the movable mirror 563*a* does not enter the projection optical system 554 and is absorbed by a damper which is provided on its optical path. As a result, setting movable mirrors which are located at positions in predetermined coordinates at on-position and movable mirrors located at other coordinates, enables generation of light of any desired pattern for exposure (refer to the above-mentioned patents, etc.).

In the exposure device 550 having the above-mentioned construction, the laser light which is outputted from the laser device LS is inputted into the illumination optical system 552 and the laser light which is adjusted to the predetermined light flux is irradiated to the variable forming mask 563 via the mirror 553. The light that enters the variable forming mask 563 is converted to light having a predetermined pattern and enters the projection optical system 554 and is irradiated onto a predetermined position of the exposure target 565 which is held on the exposure target support table 555. This enables the exposure light corresponding to the exposure pattern to form on the exposure target 515, such as a semiconductor wafer or a liquid crystal panel, at a predetermined magnification.

As a third application example of the system provided with the laser device LS, explanation is made on an exposure device which depicts an image directly with reference to FIG. 11. The exposure device 570 causes the laser light which is outputted from the laser device to be deflected by deflection means to scan the exposure target 585 and directly depict an image having any desired preset pattern on the exposure target. In this construction example, a polygon mirror is used as an example of the deflection means.

The exposure device 570 includes a laser device LS already described, a shaping optical system 572, a polygon mirror 583, an objective optical system 574, an exposure target support table 575 that holds an exposure target 585, and a drive mechanism 576 that moves the exposure target support table 575 in a horizontal plane. The shaping optical system 572 includes a plurality of lens groups including a collimation lens and shapes the laser light which is outputted from the laser device LS and causes the shaped laser light to enter the polygon mirror 583 via the mirror 573. The polygon mirror 583 is a rotary polygonal mirror. FIG. 11 exemplifies a construction in which a mirror of a regular hexagon in a planar view is driven to rotate about an axis perpendicular to plane of paper by a mirror drive mechanism. The objective optical system 574 includes a plurality of lens groups, such as an fθ lens, a condenser lens and the like and causes the laser light scanned by the polygon mirror 583 to form an image on the exposure target 585 held on the exposure target table 575. The exposure target table 575 moves the exposure target 585 in a direction perpendicular to the direction along which the laser light is caused to scan by the polygon mirror 583 (in the direction perpendicular to the plane of paper in the figure).

Operations of the laser device LS, the polygon mirror 583, and the exposure target table 575 are controlled by a control device (not shown). The control device presets and stores data of the pattern to be depicted on the exposure target 585. The control device controls the operations of the laser device LS, the polygon mirror 583, and the exposure target table 575 according to the data of the preset pattern. This enables exposure to be performed on the exposure target 585 which is held on the exposure target table 575 according to the data of the preset pattern to form an image corresponding to the pattern.

As already mentioned, the laser device LS can generate a pulse light of any desired pattern and can perform on/off control of the generated pulse light at high speeds in units of light pulse that constitutes the generated pulse light. As a result, high precision control of the laser light per se, which is important for an exposure device which is designed to directly depict an image with a laser light without using masks, such as the exposure device according to the present construction form, can be achieved. Thus, high precision exposure can be achieved.

In the embodiment, the polygon mirror 583 which causes the laser light which is outputted from the laser device LS to scan the exposure target 585 in a direction of one axis is shown as an example of the deflection means. However, other constructions may also be used. For instance, a galvano mirror may be used instead of the polygon mirror 583. Alternatively, a construction may be adopted in which two galvano mirrors are arranged in combination with each other in two axial directions, which are perpendicular to each other, to enable the laser light which is outputted from the laser device LS to scan the exposure target 585 in the two axial directions.

Figure 12:
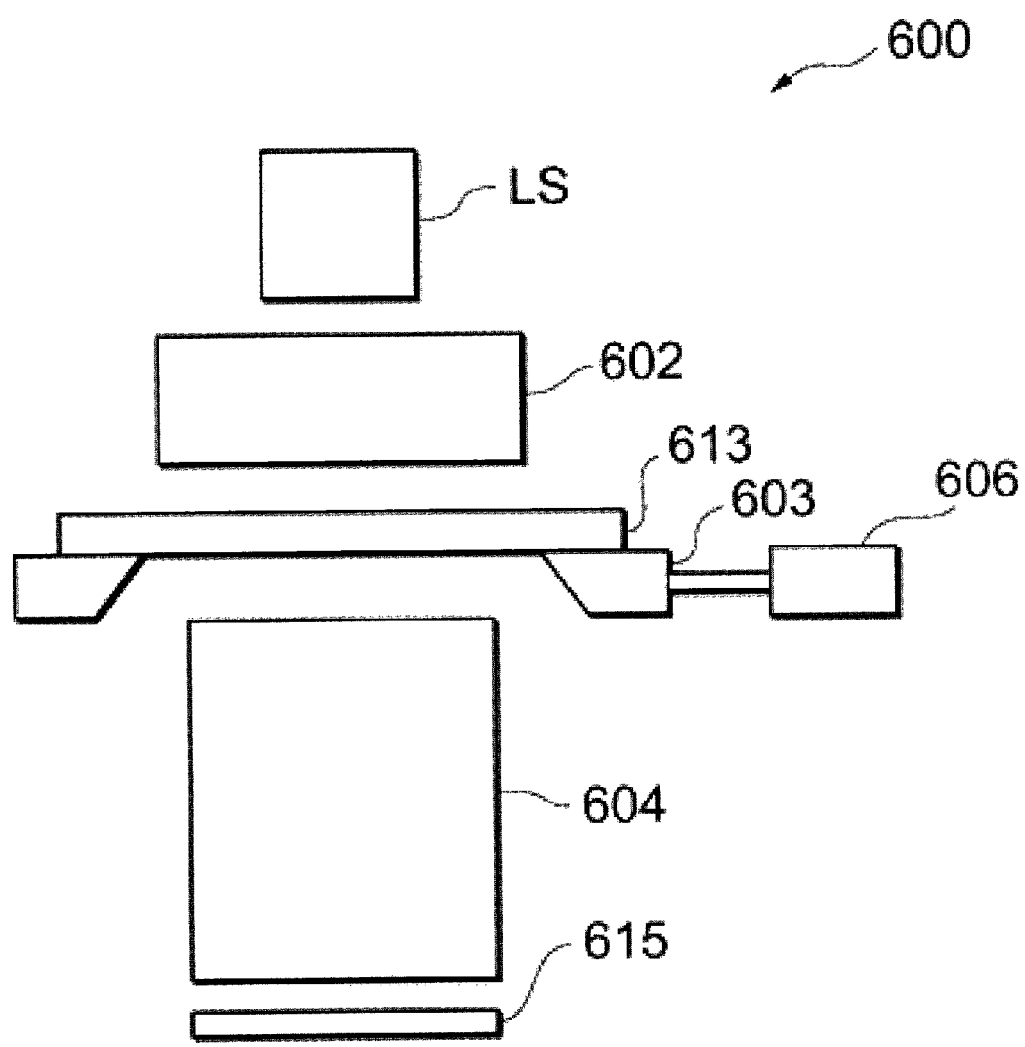
FIG. 12 is a schematic construction diagram showing an inspection device presented as a fourth application example of a system provided with a laser device.
Figure 1:
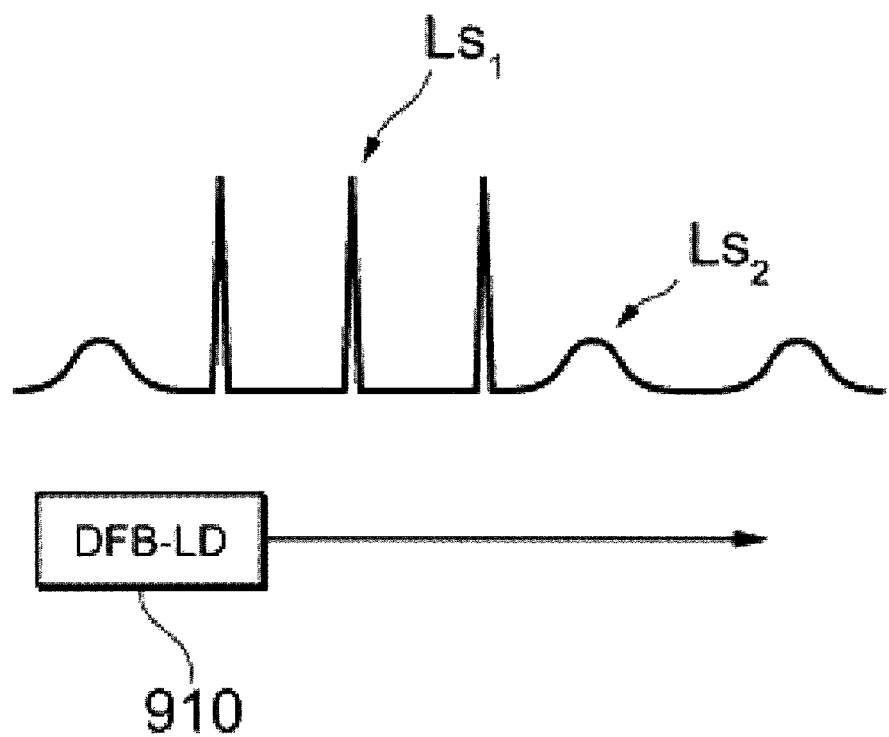
Figure 14:
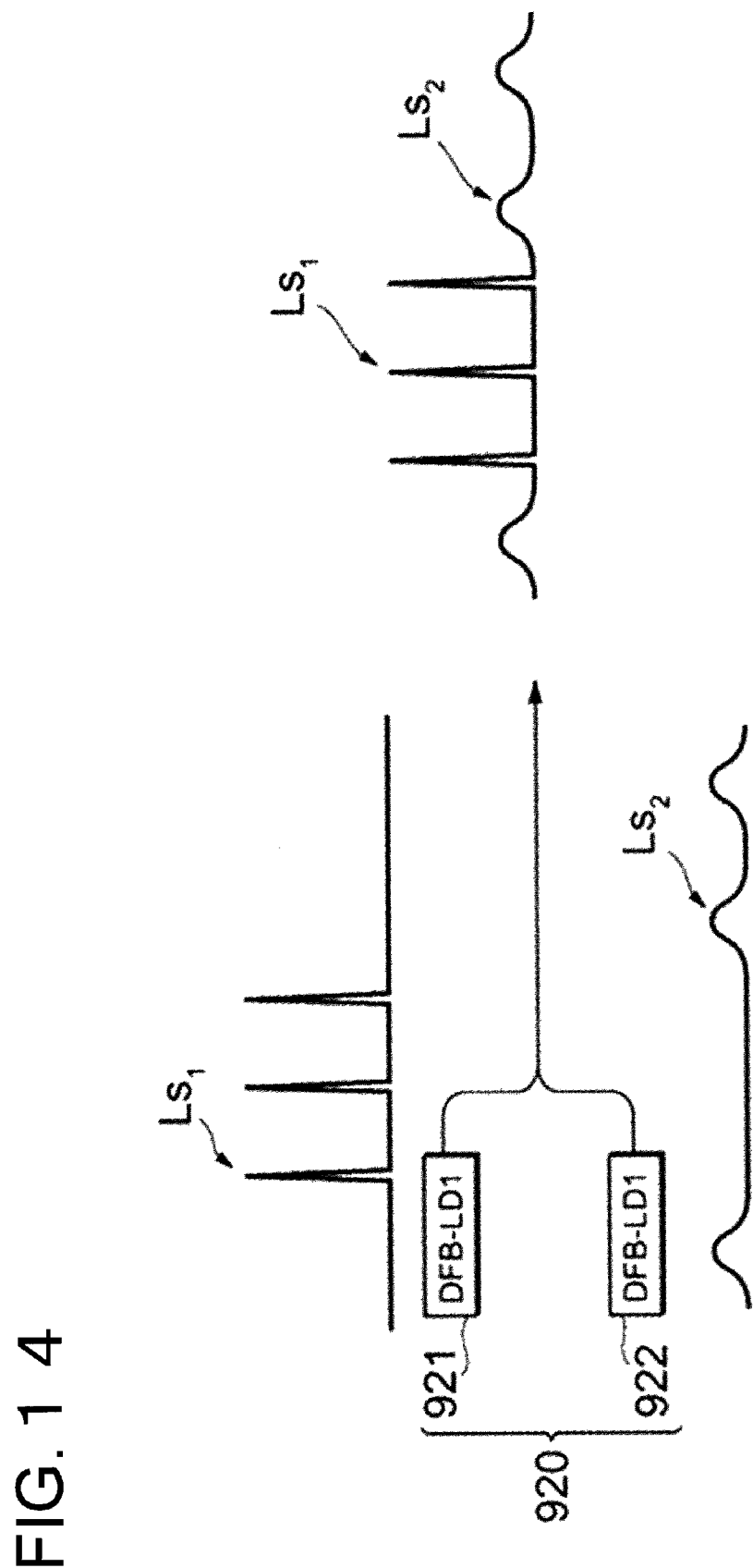
FIG. 14 is a diagram illustrating a schematic construction and operation of a laser light generation unit conceived as a first technology.
Figure 15:
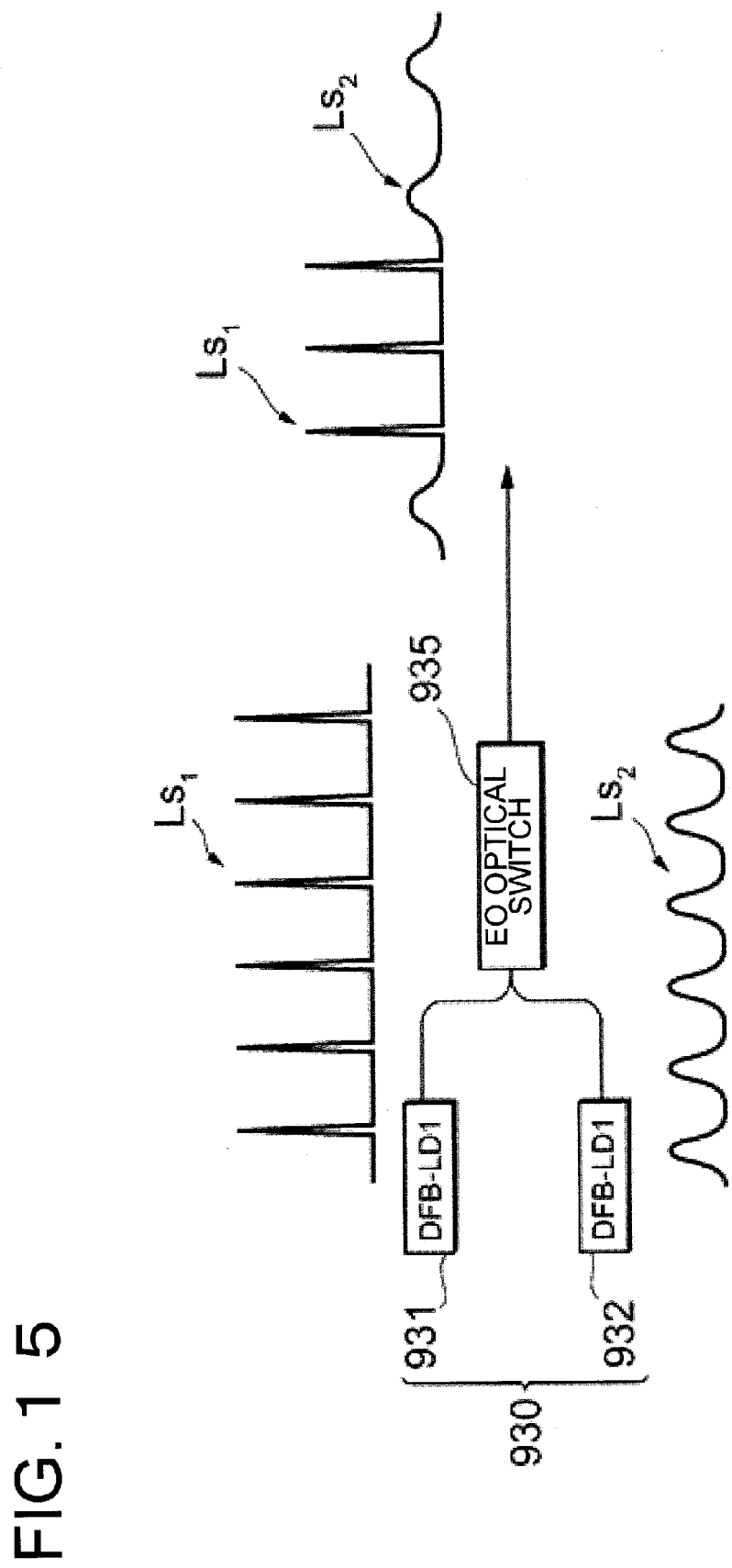
FIG. 15 is a diagram illustrating a schematic construction and operation of a laser light generation unit conceived as a second technology.

Next, as a fourth application example of the system provided with the laser device LS, explanation is made on an inspection device for use in a process of inspecting photomasks, liquid crystal panels, wafers, etc. (inspection target) with reference to FIG. 12 showing a schematic construction of it. The inspection device 600 which is shown in FIG. 12 as an example can be advantageously used for inspecting a fine device pattern depicted on a light-permeable inspection target 613, such as a photomask.

The inspection device 600 includes a laser device LS described above, an illumination optical system 602, an inspection target support stage 603 that holds the inspection target 613, a projection optical system 604, a TDI (Time Delay Integration) sensor 615 that detects light from the inspection target 613, and a drive mechanism 606 that moves the inspection target support stage 603 in a horizontal plane. The illumination optical system 602 includes a plurality of lens groups and adjusts the laser light which is outputted from the laser device LS to a predetermined light flux and irradiates the adjusted light onto the inspection target 613 which is held on the inspection target support stage 603. The projection optical system 604 also includes a plurality of lens groups and projects the light that has passed through the inspection target 613 onto the TDI sensor 615.

In the inspection device 600 having the above-mentioned construction, the laser light which is outputted from the laser device LS is inputted into the illumination optical system 602 and the laser light which is adjusted to the predetermined light flux is irradiated onto the inspection target 613, such as a photomask or the like, held on the inspection target support stage 603. The light from the inspection target 613 (transmitted light in this construction example), has an image of the device pattern which is depicted on the inspection target 613 and this light is projected onto the TDI sensor 615 via the projection optical system 604 to form an image on the TDI sensor 615. In this case, horizontal movement rate of the inspection target support stage 603 by the drive mechanism 606 and the transfer clock of the TDI sensor 615 are controlled to be in synchronization with each other.

As a result, the image of the device pattern on the inspection target 613 is inspected by the TDI sensor 615. Comparing the inspected image of the inspection target 613 thus inspected with a preset predetermined reference image enables detection of any defect of the fine pattern depicted on the inspection target. For the inspection target 613 that is light-impermeable, such as a wafer or the like, the light reflected from the inspection target is inputted into the projection optical system 604 and conducted to the TDI sensor 615. This enables an inspection device to be configured similarly.

What is claimed is:

1. A laser device comprising:
    a laser light source which generates a laser light in a pulse waveform of a preset predetermined frequency;
    an intensity modulator which is driven with a transmittance waveform wherein transmittance changes at either the predetermined frequency or an integer-multiple frequency thereof and which modulates the laser light which is outputted from the laser light source based on the transmittance waveform;
    a control unit which controls an operation of the intensity modulator;
    an amplifier which amplifies the laser light which is outputted from the intensity modulator; and
    a wavelength conversion optical element which converts a wavelength of the laser light which has been amplified by the amplifier, wherein
    the control unit changes relative timing of the transmittance waveform with respect to the pulse waveform, thereby changing the pulse waveform of the laser light which is emitted from the intensity modulator, so that the wavelength conversion optical element converts the wavelength of the laser light which has been amplified by the amplifier to have a different efficiency of wavelength conversion based on the relative timing and outputs a pulse light of a predetermined waveform from the wavelength conversion optical element.

2. The laser device according to claim 1, wherein
    the laser light which is outputted from the intensity modulator includes either a laser light in a first pulse waveform of the predetermined frequency or a laser light in a second pulse waveform of the predetermined frequency which has different timing with respect to that of the laser light in the first pulse waveform,
    the laser light in the first pulse waveform is a light which is set so that an efficiency of wavelength conversion at the wavelength conversion optical element is relatively high so as to generate the pulse light, the laser light in the second pulse waveform is a light which is set to have energy substantially the same as that of the laser light in the first pulse waveform and a relatively low efficiency of wavelength conversion at the wavelength conversion optical element so as not to generate the pulse light.

3. The laser device according to claim 2, wherein the laser light source includes a first laser light source that generates a laser light in the first pulse waveform of the predetermined frequency and a second laser light source which generates a laser light in a second pulse waveform of the predetermined frequency at timing different from timing at which the laser light in the first pulse waveform is generated, the laser light in the first pulse waveform which is outputted from the first laser light source and the laser light in the second pulse waveform which is outputted from the second laser light source are multiplexed and inputted into the intensity modulator, the transmittance waveform is an on/off gate-like waveform which is switched between a transmission state in which the laser light is transmitted at the predetermined frequency and a shutoff state in which the laser light is shutoff, and the control unit changes relative timing of the transmittance waveform with respect to the first pulse waveform and the second pulse waveform, thereby changing the pulse waveform of the laser light which is transmitted through the intensity modulator.

4. The laser device according to claim 3, wherein the laser light in the first pulse waveform and the laser light in the second pulse waveform differ in peak intensity from each other.

5. The laser device according to claim 3, wherein the laser light in the first pulse waveform and the laser light in the second pulse waveform differ in wavelength from each other.

6. The laser device according to claim 3, wherein the laser light in the first pulse waveform and the laser light in the second pulse waveform differ in a state of polarization upon entering the wavelength conversion optical element from each other.

7. The laser device according to claim 3, wherein the first laser light source and the second laser light source are each a semiconductor laser.

8. The laser device according to claim 3, wherein the first laser light source is a mode-locked laser which generates the laser light in the first pulse waveform at the predetermined frequency and the second laser light source is a semiconductor laser, the laser device comprises a photodetector which detects the laser light in the first pulse waveform which is outputted from the mode-locked laser; and a synchronization circuit which, based on the first pulse waveform which is detected by the photodetector, outputs a synchronization signal to a drive power source of the second laser light source and to the control unit.

9. The laser device according to claim 3, wherein the laser light in the first pulse waveform which is outputted from the first laser light source and the laser light in the second pulse waveform which is outputted from the second laser light source are once multiplexed and then divided into a plurality of branch optical paths, each of the intensity modulator, the wavelength conversion optical element, and the amplifier is provided at each of the plurality of branch optical paths, the control unit changes the relative timing of the transmittance waveform with respect to the first pulse waveform and the second pulse waveform for each branch optical path, thereby enabling each of the waveform conversion optical elements to output a plurality of pulse lights of different pulse waveforms.

10. The laser device according to claim 2, wherein the laser light source is a light source that generates a laser light of a base waveform at the predetermined frequency, the transmittance waveform is a high and low gate-like waveform in which a first transmittance waveform which has a relatively high transmittance and with which the laser light in the first pulse waveform is extracted from the laser light of the base waveform and a second transmittance waveform which has a relatively low transmittance and with which the laser light in the second pulse waveform is extracted from the laser light of the base waveform are alternately repeated each at the predetermined frequency, and the control unit changes relative timing of the transmittance waveform with respect to the base waveform, thereby changing the pulse waveform of the laser light that is transmitted through the intensity modulator.

11. The laser device according to claim 2, wherein the laser light source includes a first laser light source that generates a laser light of a first base waveform at the predetermined frequency and a second laser light source that generates a laser light of a second base waveform at the predetermined frequency and at different timing from that at which the laser light of the first base waveform is generated, the laser light of the first base waveform which is outputted from the first laser light source and the laser light of the second base waveform which is outputted from the second laser light source are multiplexed and inputted into the intensity modulator, the transmittance waveform is a gate-like waveform in which a first transmittance waveform with which the laser light in the first pulse waveform is extracted from the laser light of the first base waveform and a second transmittance waveform with which the laser light in the second pulse waveform is extracted from the laser light of the second base waveform are alternately repeated each at the predetermined frequency, the control unit changes relative timing of the transmittance waveform with respect to the first base waveform and the second base waveform, thereby changing the pulse waveform of the laser light that is transmitted through the intensity modulator.

12. The laser device according to claim 11, wherein the laser light in the first pulse waveform and the laser light in the second pulse waveform differ in peak intensity from each other.

13. The laser device according to claim 11, wherein the laser light of the first base waveform and the laser light of the second base waveform differ in wavelength from each other.

14. The laser device according to claim 11, wherein the laser light of the first base waveform and the laser light of the second base waveform differ from each other in a state of polarization upon entering the wavelength conversion optical element.

15. The laser device according to claim 11, wherein
the laser light of the first base waveform which is outputted from the first laser light source and the laser light of the second base waveform which is outputted from the second laser light source are once multiplexed with each other and then divided into a plurality of branch optical paths,
each of the intensity modulator, the amplifier, and the wavelength conversion optical element is provided at each of the plurality of branch optical paths,
the control unit changes the relative timing of the transmittance waveform with respect to the first base waveform and the second base waveform for each branch optical path, thereby enabling each of the wavelength conversion optical elements to output a plurality of pulse lights of different pulse waveforms.

16. An exposure device comprising:
the laser device according to claim 1;
a mask support unit that holds a photomask on which a predetermined exposure pattern is formed;
an exposure target support unit that holds an exposure target;
an illumination optical system that illuminates the photomask held by the mask support unit with the laser light outputted from the laser device; and
a projection optical system that projects the light which has been transmitted through the photomask onto the exposure target which is held by the exposure target support unit.

17. An exposure device comprising:
the laser device according to claim 1;
a variable forming mask which has a plurality of movable mirrors and generates a light of any desired pattern;
an exposure target support unit which holds an exposure target;
an illumination optical system which illuminates the variable forming mask with the laser light outputted from the laser device; and
a projection optical system that projects the light of any desired pattern generated via the variable forming mask onto the exposure target which is held by the exposure target support unit.

18. An exposure device comprising:
the laser device according to claim 1;
an exposure target support unit which holds an exposure target;
a deflection unit which deflects the laser light which is outputted from the laser device to scan the exposure target which is held on the exposure target support unit; and
an objective optical system which forms an image of the light deflected by the deflection unit on the exposure target.

19. An inspection device comprising:
the laser device according to claim 1;
an inspection target support unit which holds an inspection target;
an illumination optical system which illuminates the inspection target which is held by the inspection target support unit with the laser light which is outputted from the laser device; and
a projection optical system that projects the light from the inspection target onto a detector.

* * * * *